US012598876B2

(12) United States Patent
Nagata et al.

(10) Patent No.: US 12,598,876 B2
(45) Date of Patent: Apr. 7, 2026

(54) BENDABLE DISPLAY DEVICE

(71) Applicant: SEMICONDUCTOR ENERGY LABORATORY CO., LTD., Atsugi (JP)

(72) Inventors: Takaaki Nagata, Isehara (JP); Tatsuya Sakuishi, Atsugi (JP); Kohei Yokoyama, Fujisawa (JP); Yasuhiro Jinbo, Isehara (JP); Taisuke Kamada, Niiza (JP); Akihiro Chida, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 690 days.

(21) Appl. No.: 17/899,816

(22) Filed: Aug. 31, 2022

(65) Prior Publication Data

US 2022/0416183 A1 Dec. 29, 2022

Related U.S. Application Data

(62) Division of application No. 16/611,503, filed as application No. PCT/IB2018/053275 on May 11, 2018, now Pat. No. 11,444,255.

(30) Foreign Application Priority Data

May 18, 2017 (JP) ................................. 2017-098709

(51) Int. Cl.
H10K 59/131 (2023.01)
H05K 1/189 (2026.01)
(Continued)

(52) U.S. Cl.
CPC ........... H10K 59/131 (2023.02); H05K 1/189 (2013.01); H10K 59/873 (2023.02); H10K 71/00 (2023.02);
(Continued)

(58) Field of Classification Search
CPC ............ H10K 77/111; H10K 2102/311; H10K 59/131; H10K 59/844; H10K 59/873; H01L 51/0097; H01L 2251/5338; H01L 27/3276
See application file for complete search history.

(56) References Cited

U.S. PATENT DOCUMENTS 7,022,619 B2 4/2006 Yamanaka et al.
7,531,957 B2 5/2009 Sakamoto
(Continued)

FOREIGN PATENT DOCUMENTS

CN 102043300 A 5/2011
CN 102422338 A 4/2012
(Continued)

OTHER PUBLICATIONS

International Search Report (Application No. PCT/IB2018/053275) Dated Aug. 14, 2018.
(Continued)

*Primary Examiner* — Kevin Parendo
(74) *Attorney, Agent, or Firm* — NIXON PEABODY LLP; Jeffrey L. Costellia

(57) ABSTRACT

A flexible display device is manufactured with high yield. A display device having high resistance to repeated bending is provided. The display device is manufactured by forming a separation layer over a support substrate; forming, over the separation layer, an inorganic insulating layer including a first portion and a second portion; forming a display element over the inorganic insulating layer to be overlapped with the first portion; forming a connection electrode over the inorganic insulating layer to be overlapped with the second portion; sealing the display element; separating the support substrate and the inorganic insulating layer using the separation layer; attaching a substrate to the inorganic insulating layer to be overlapped with the first portion; and etching the (Continued)

second portion using the substrate as a mask to expose the connection electrode.

14 Claims, 27 Drawing Sheets

(51) Int. Cl.
| | |
|---|---|
| *H10K 59/38* | (2023.01) |
| *H10K 59/80* | (2023.01) |
| *H10K 71/00* | (2023.01) |
| *H10K 71/16* | (2023.01) |
| *H10K 77/10* | (2023.01) |

(52) U.S. Cl.
CPC ......... *H10K 71/166* (2023.02); *H10K 77/111* (2023.02); *H05K 2201/10128* (2013.01); *H10K 59/38* (2023.02)

(56) References Cited

U.S. PATENT DOCUMENTS

| | | | |
|---|---|---|---|
| 8,319,725 | B2 | 11/2012 | Okamoto et al. |
| 8,810,508 | B2 | 8/2014 | Okamoto et al. |
| 8,956,891 | B2 | 2/2015 | Chida |
| 9,024,863 | B2 | 5/2015 | Okamoto et al. |
| 9,065,034 | B2 | 6/2015 | Chida |
| 9,196,813 | B2 | 11/2015 | Chida |
| 9,397,117 | B2 | 7/2016 | Okamoto et al. |
| 9,437,832 | B2 | 9/2016 | Sakuishi et al. |
| 9,444,020 | B2 | 9/2016 | Chida |
| 9,887,392 | B2 | 2/2018 | Sakuishi et al. |
| 9,978,981 | B2 | 5/2018 | Chida |
| 9,980,389 | B2 | 5/2018 | Okamoto et al. |
| 10,038,171 | B2 | 7/2018 | Sakuishi et al. |
| 10,079,353 | B2 | 9/2018 | Sakuishi et al. |
| 10,141,526 | B2 | 11/2018 | Sakuishi et al. |
| 10,153,460 | B2 | 12/2018 | Isaka et al. |
| 10,204,535 | B2 | 2/2019 | Yamazaki |
| 10,367,014 | B2 | 7/2019 | Yamazaki et al. |
| 10,403,703 | B2 | 9/2019 | Yamazaki |
| 10,490,766 | B2 | 11/2019 | Chida |
| 10,734,596 | B2 | 8/2020 | Chida |
| 11,075,232 | B2 | 7/2021 | Yamazaki et al. |
| 11,201,308 | B2 | 12/2021 | Chida |
| 2006/0273307 | A1 | 12/2006 | Wang et al. |
| 2007/0080627 | A1 | 4/2007 | Sakamoto |
| 2009/0057861 | A1 | 3/2009 | Park et al. |
| 2010/0277448 | A1 | 11/2010 | Okamoto et al. |
| 2011/0092006 | A1 | 4/2011 | An et al. |
| 2013/0149818 | A1 | 6/2013 | Jung et al. |
| 2013/0181955 | A1 | 7/2013 | Okamoto et al. |
| 2013/0299789 | A1 | 11/2013 | Yamazaki et al. |
| 2013/0316475 | A1 | 11/2013 | Yu et al. |
| 2013/0334534 | A1 | 12/2013 | Fujii et al. |
| 2014/0354612 | A1 | 12/2014 | Okamoto et al. |
| 2015/0236052 | A1 | 8/2015 | Okamoto et al. |
| 2015/0236280 | A1 | 8/2015 | Sakuishi et al. |
| 2015/0255527 | A1 | 9/2015 | Oooka et al. |
| 2015/0372065 | A1 | 12/2015 | Yamazaki |
| 2016/0300853 | A1 | 10/2016 | Yamazaki |
| 2017/0040569 | A1 | 2/2017 | Watabe et al. |
| 2017/0092885 | A1 | 3/2017 | Sakuishi et al. |
| 2017/0125453 | A1 | 5/2017 | Hayk et al. |
| 2017/0237033 | A1 | 8/2017 | Koshihara et al. |
| 2017/0294463 | A1 | 10/2017 | Yamazaki et al. |
| 2018/0076401 | A1 | 3/2018 | Sakuishi et al. |
| 2018/0270959 | A1 | 9/2018 | Okamoto et al. |
| 2021/0257394 | A1 | 8/2021 | Yamazaki et al. |
| 2022/0102667 | A1 | 3/2022 | Chida |

FOREIGN PATENT DOCUMENTS

| | | |
|---|---|---|
| CN | 104597651 A | 5/2015 |
| CN | 106463082 A | 2/2017 |
| GB | 2474737 | 4/2011 |
| GB | 2479081 | 9/2011 |
| JP | 2002-359070 A | 12/2002 |
| JP | 2004-006633 A | 1/2004 |
| JP | 2010-139741 A | 6/2010 |
| JP | 2010-282183 A | 12/2010 |
| JP | 2011-222530 A | 11/2011 |
| JP | 2013-231982 A | 11/2013 |
| JP | 2014-002250 A | 1/2014 |
| JP | 2014-197522 A | 10/2014 |
| JP | 2015-015232 A | 1/2015 |
| JP | 2015-173104 A | 10/2015 |
| JP | 2015-181099 A | 10/2015 |
| JP | 2016-027388 A | 2/2016 |
| JP | 2016-085461 A | 5/2016 |
| JP | 2016-197238 A | 11/2016 |
| JP | 2017-201421 A | 11/2017 |
| JP | 2018-032021 A | 3/2018 |
| KR | 2011-0043374 A | 4/2011 |
| KR | 2016-0124756 A | 10/2016 |
| KR | 2017-0020854 A | 2/2017 |
| KR | 2017-0051595 A | 5/2017 |
| TW | 200511882 | 3/2005 |
| TW | 201110075 | 3/2011 |
| TW | 201115249 | 5/2011 |
| TW | 201539779 | 10/2015 |
| TW | 201607021 | 2/2016 |
| TW | 201705106 | 2/2017 |
| WO | WO-2005/027582 | 3/2005 |
| WO | WO-2010/128614 | 11/2010 |
| WO | WO-2015/125046 | 8/2015 |
| WO | WO-2015/198183 | 12/2015 |
| WO | WO-2016/067144 | 5/2016 |

OTHER PUBLICATIONS

Written Opinion (Application No. PCT/IB2018/053275) Dated Aug. 14, 2018.

FIG. 2A   <u>S1, S2</u>
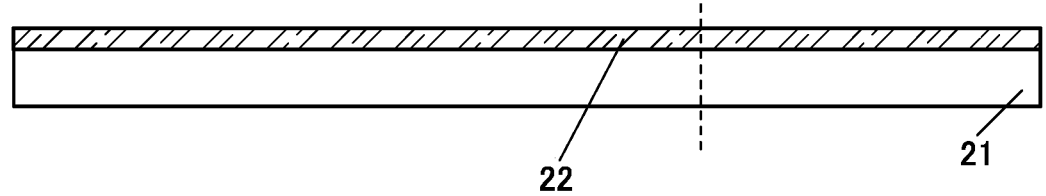
22    21
FIG. 2B   <u>S3</u>
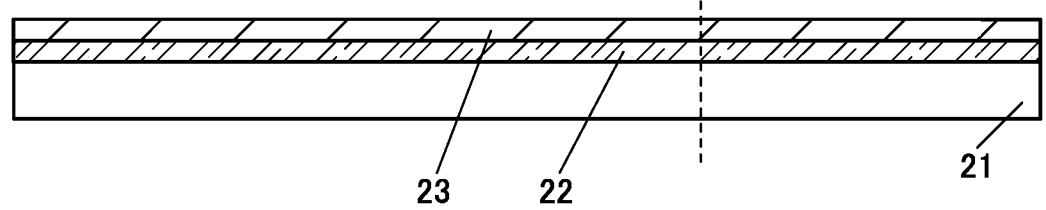
23   22    21
FIG. 2C
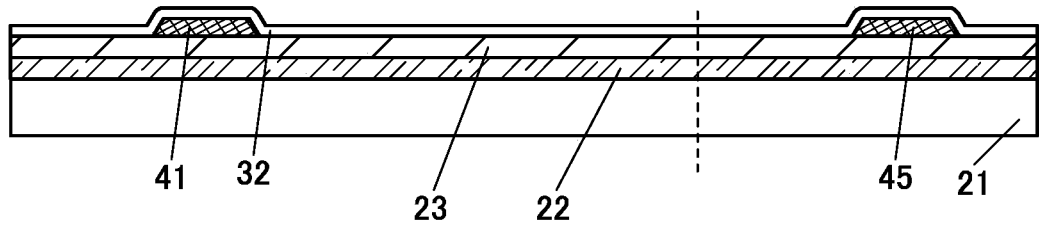
41   32    23   22    45   21
FIG. 2D
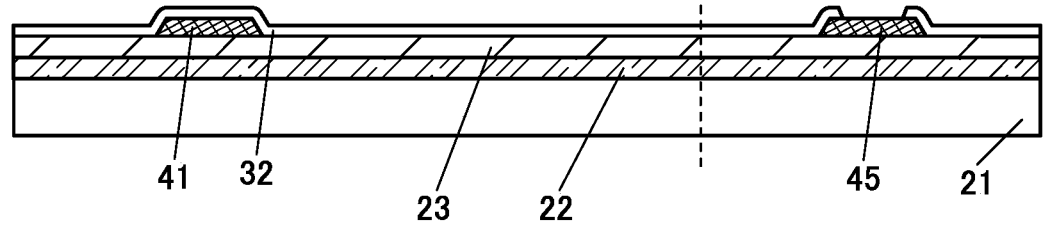
41   32    23   22    45   21
FIG. 2E   <u>S4</u>
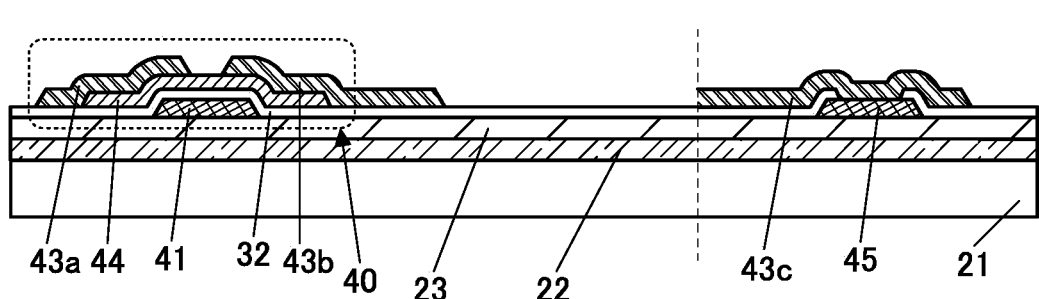
43a   44   41   32   43b   40   23   22    43c   45   21

40   23   33   22   34   43c   45   21

35

33   40   23   61   22   34   43c   45   21

S5

35

33   22   40   23   61   62   63   60   34   43c   45   21

S6

74   35

33   22   40   23   60   34   43c   45   21

FIG. 5A  S7
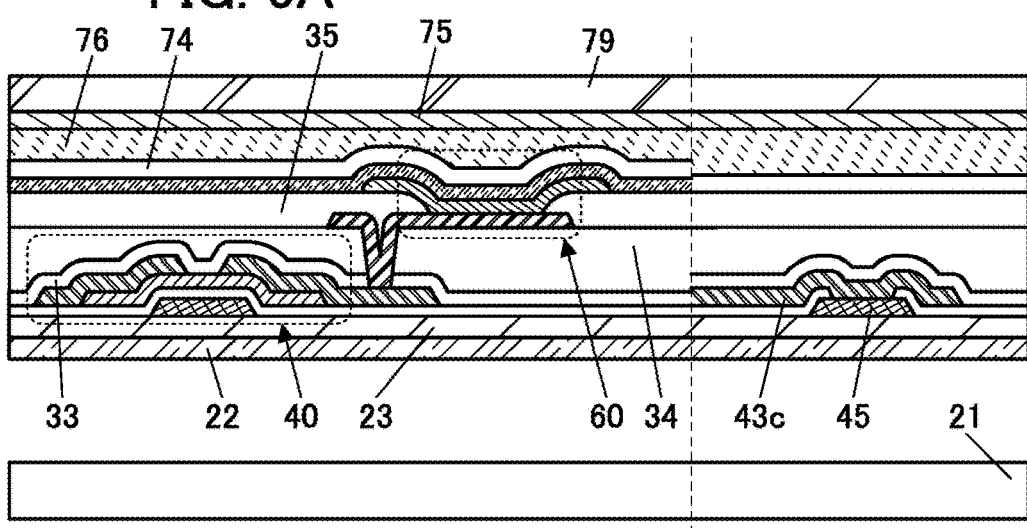
FIG. 5B  S7
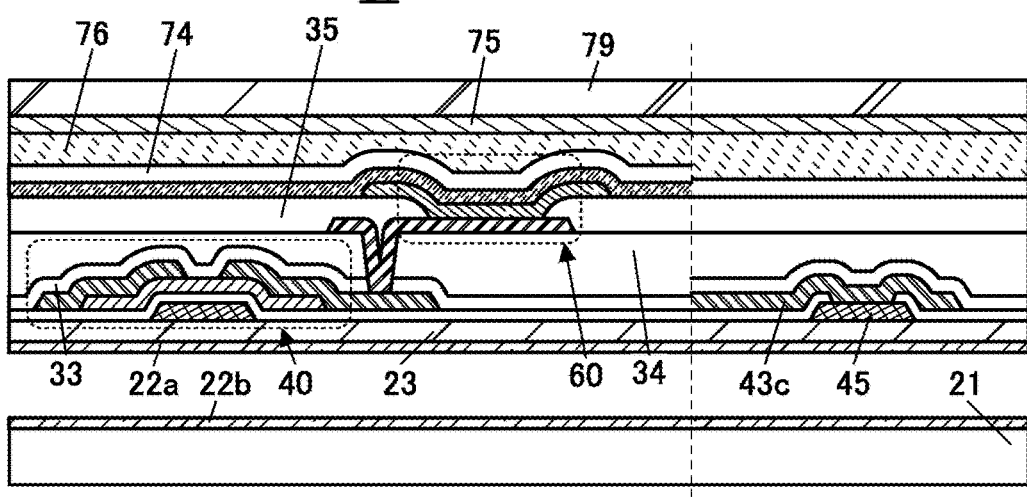
FIG. 5C  S7
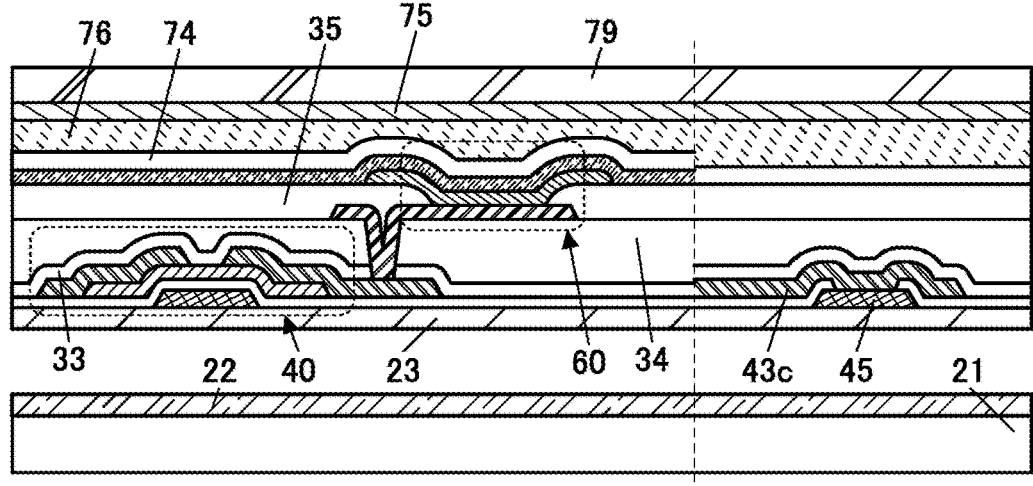

FIG. 6A    <u>S8</u>
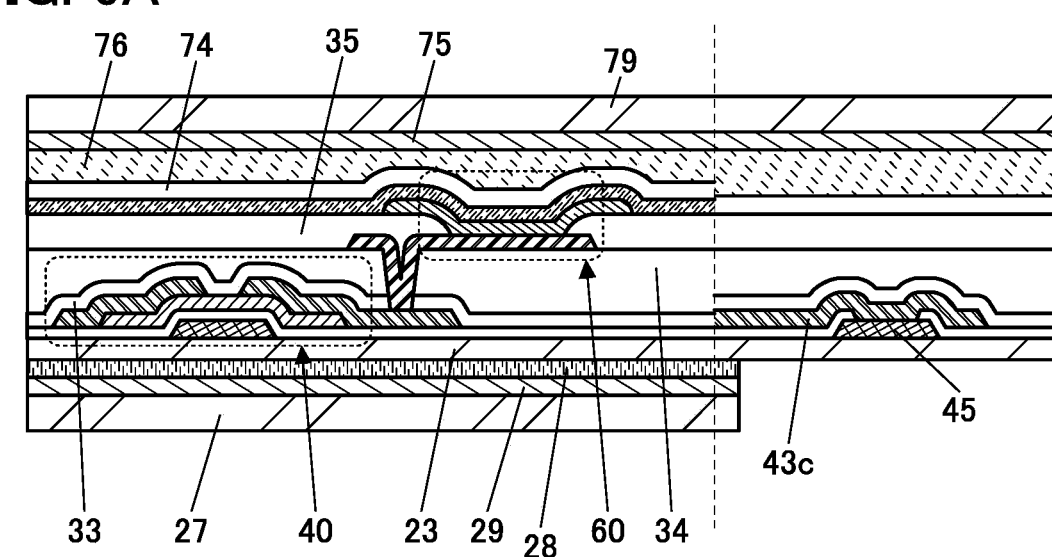
FIG. 6B    <u>S9</u>
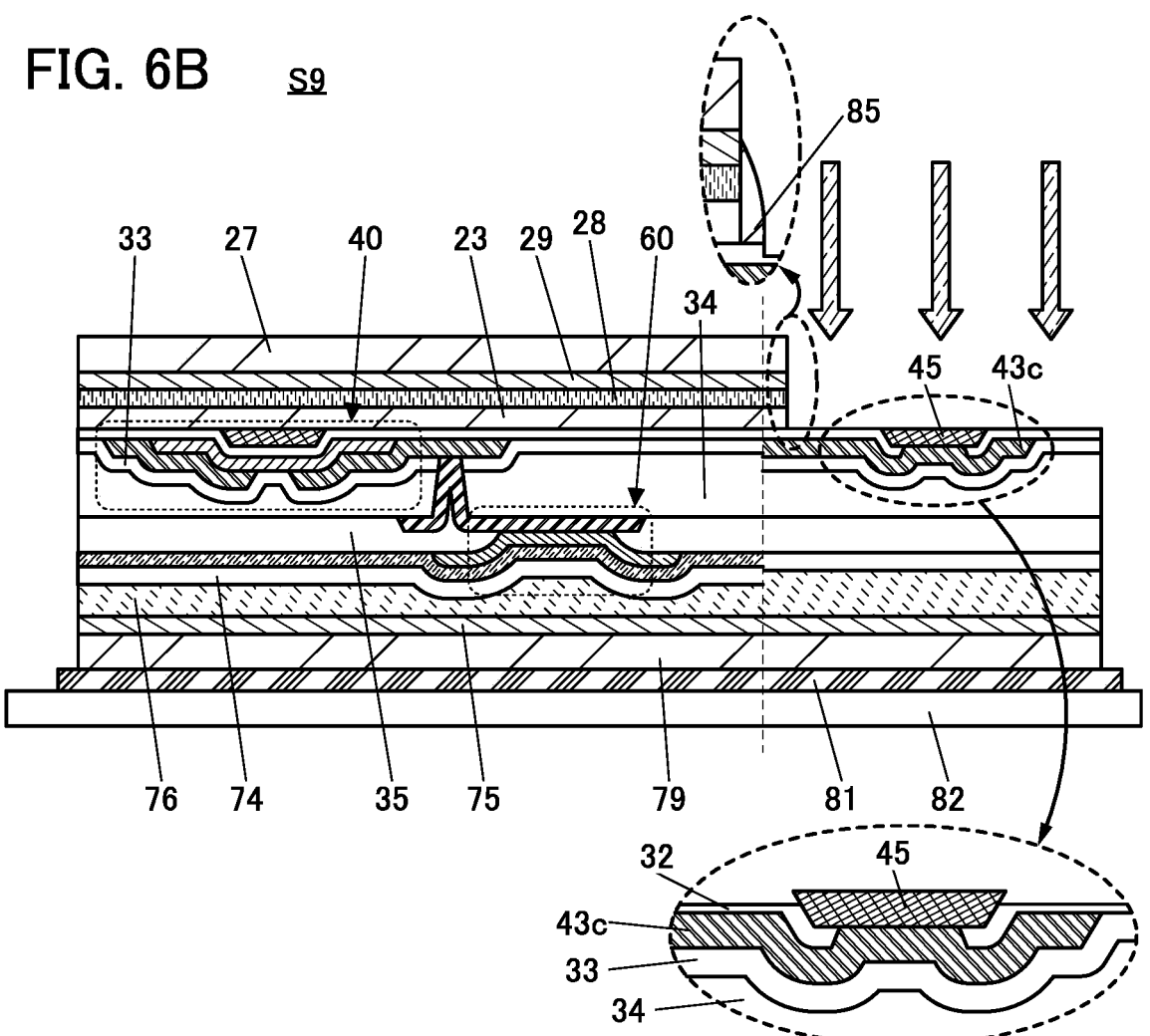

FIG. 11A  S1, S2
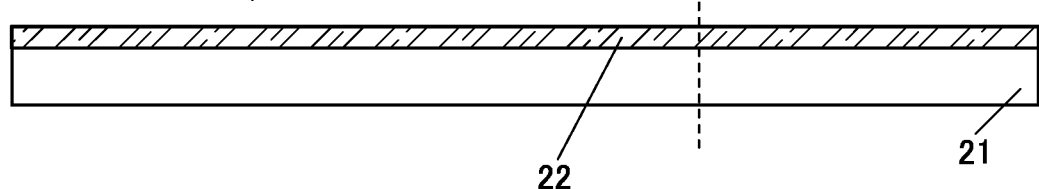
22    21
FIG. 11B  S3
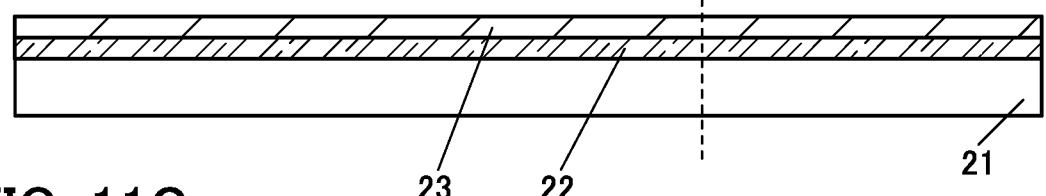
23    22    21
FIG. 11C
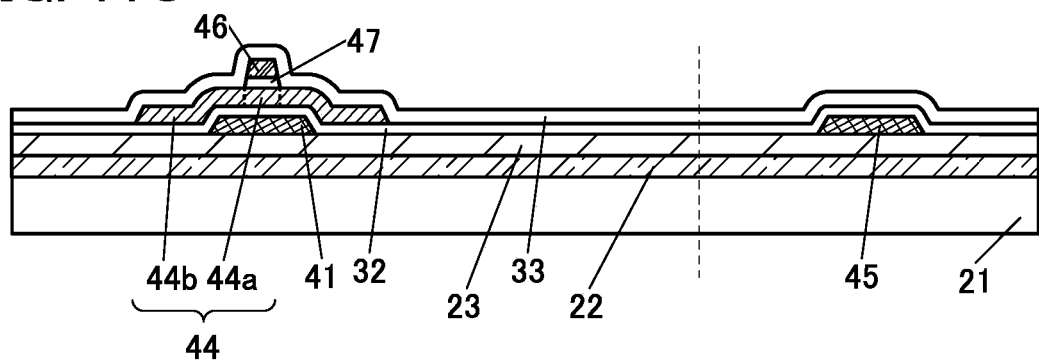
46   47
44b 44a   41 32   23   33   22   45   21
44
FIG. 11D
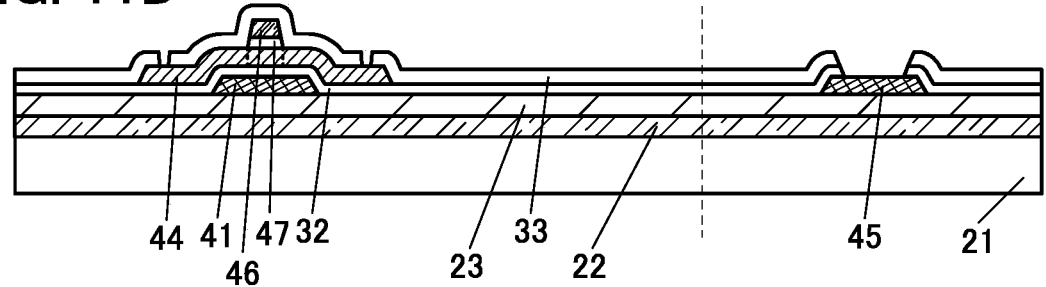
44 41 47 32   23   33   22   45   21
46
FIG. 11E  S4
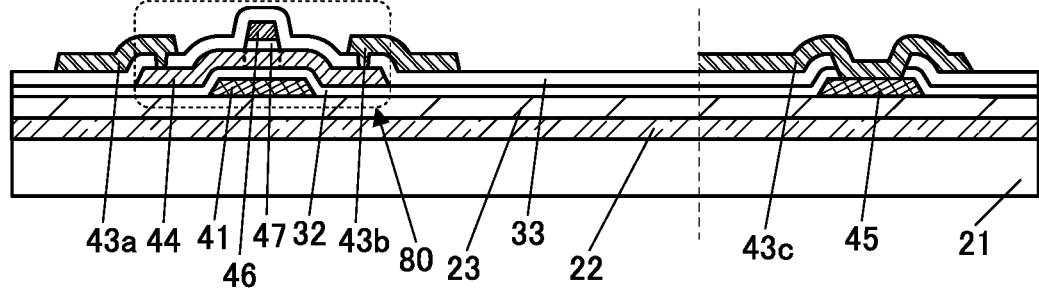
43a 44 41 47 32 43b   80 23   33   22   43c   45   21
46

FIG. 12A  S5
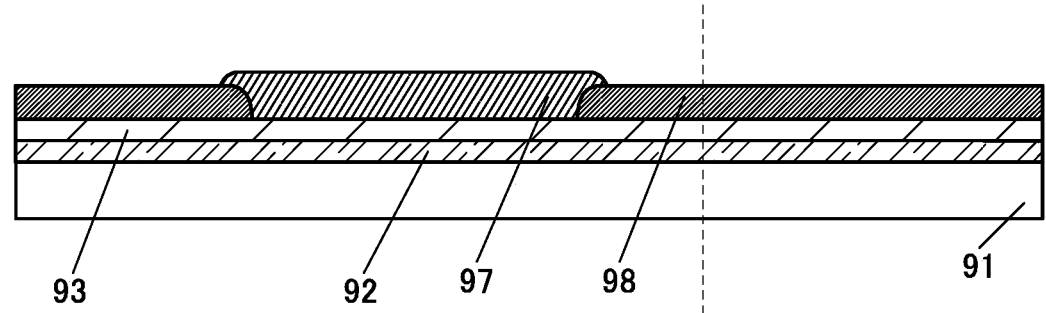
35
33  23  80  22  61  62  63  60  34  43c  45  21
FIG. 12B  S11, S12, S13, S14
93  92  97  98  91
FIG. 12C  S15
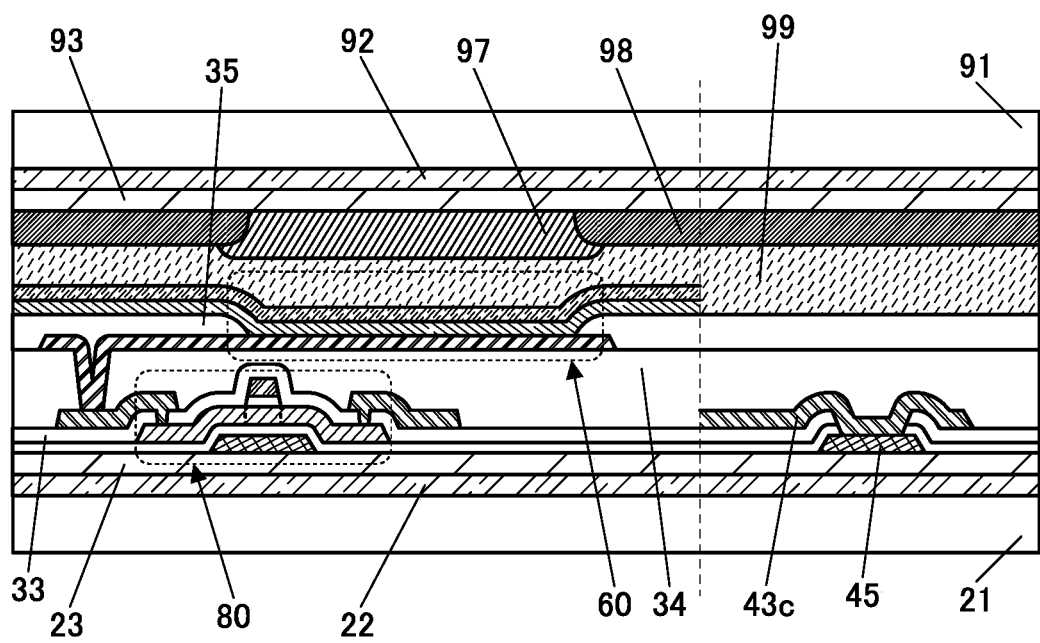
93  35  92  97  98  99  91
33  23  80  22  60  34  43c  45  21

FIG. 13A  S16
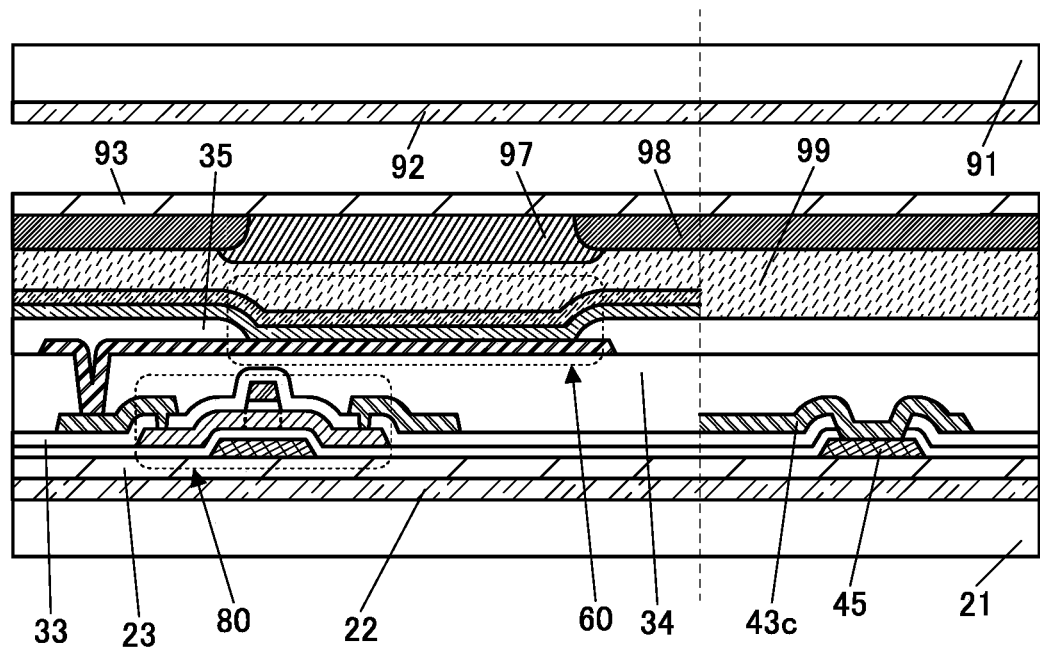
FIG. 13B  S17
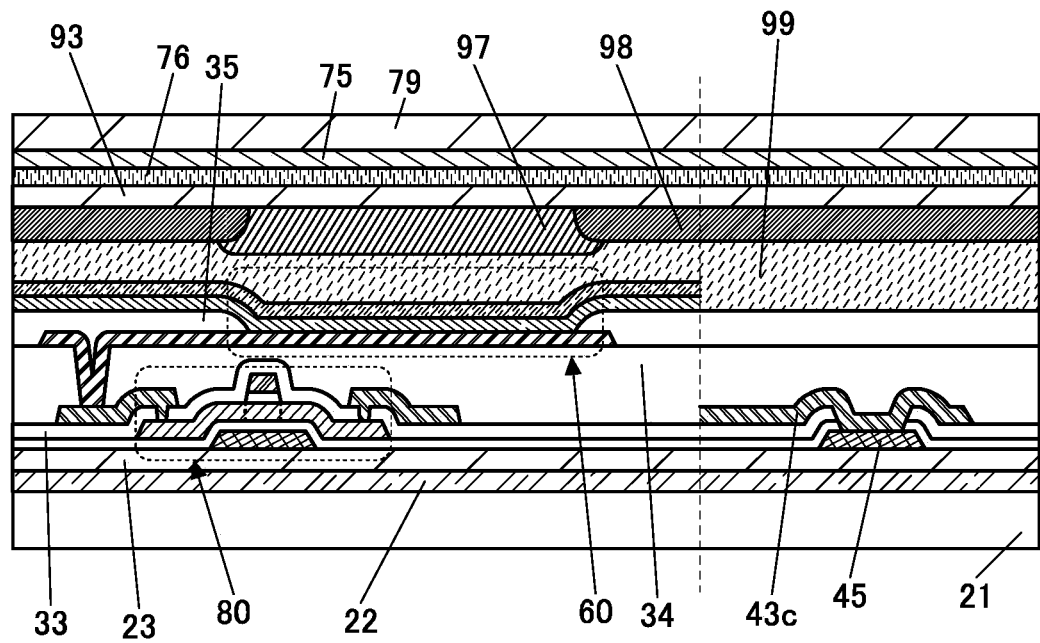

FIG. 14A  S7
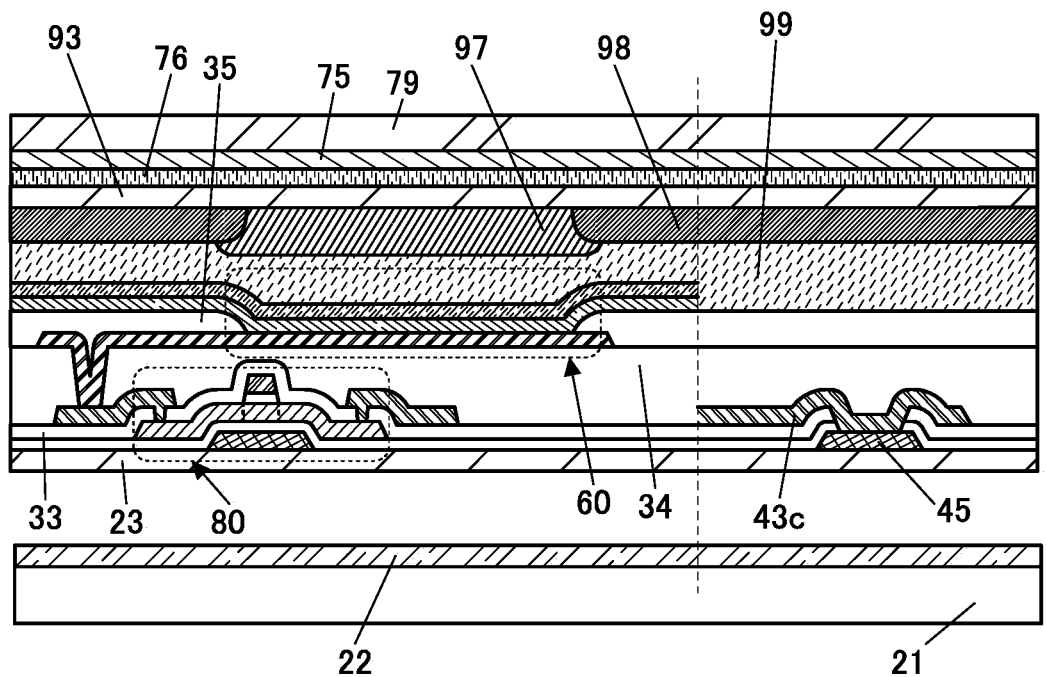
FIG. 14B  S8
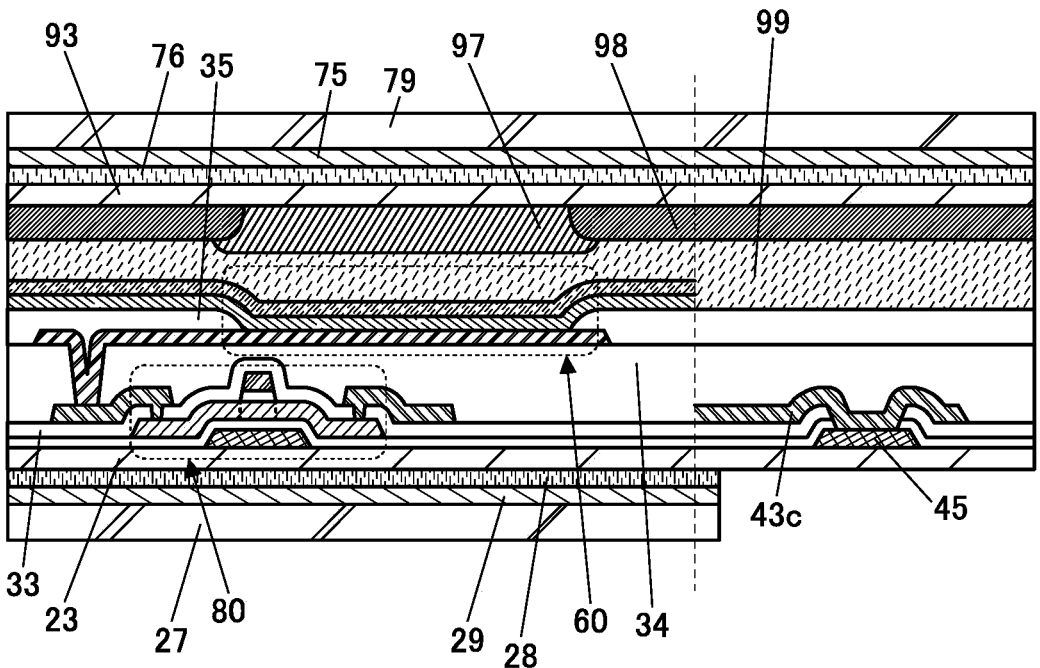

FIG. 16A    10E
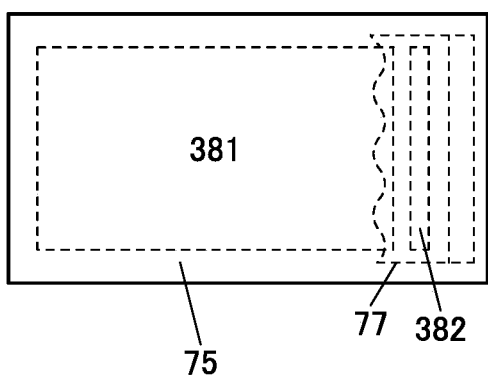
FIG. 16B    10E
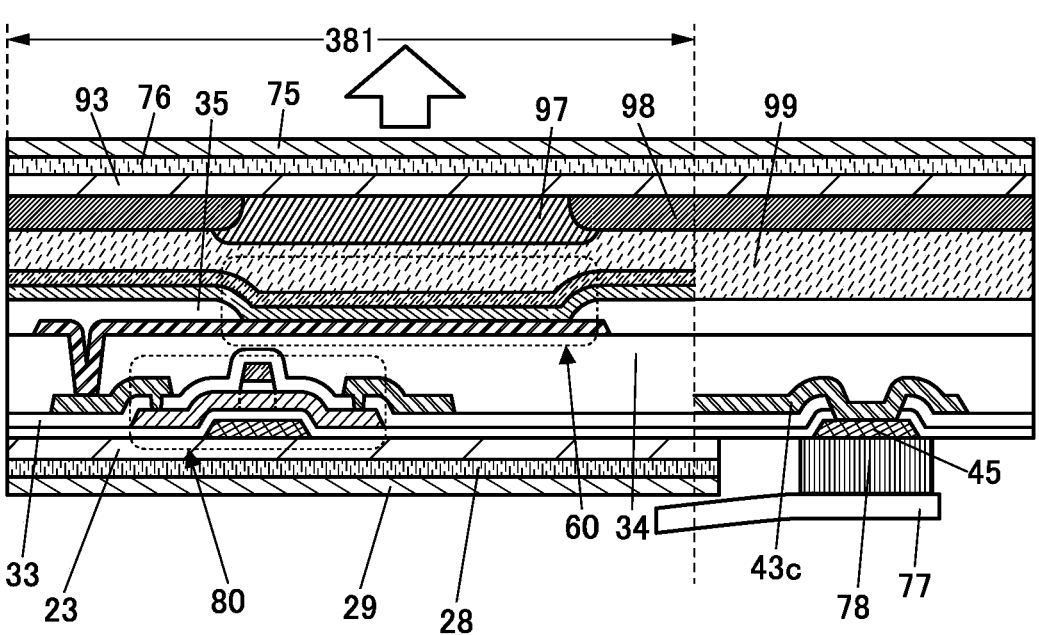
FIG. 16C
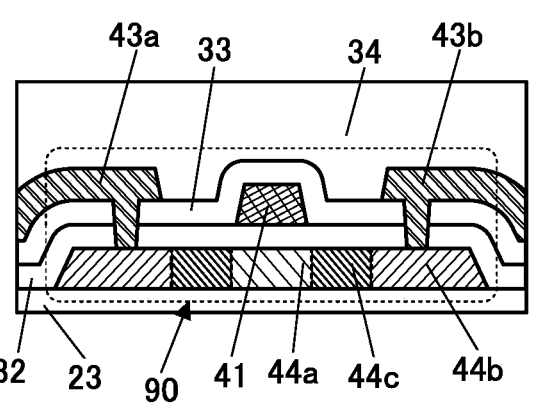
FIG. 16D
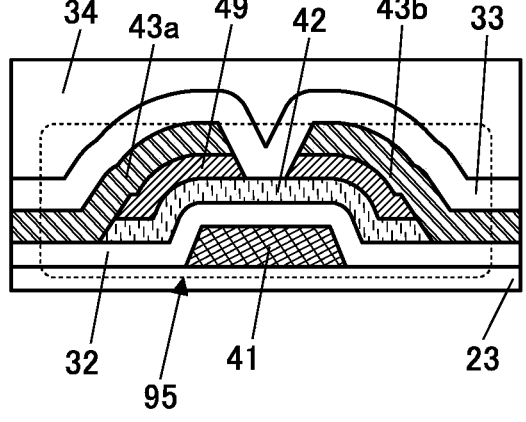

FIG. 17A1
FIG. 17A2  10A, 10B
FIG. 17B1
FIG. 17B2  10E
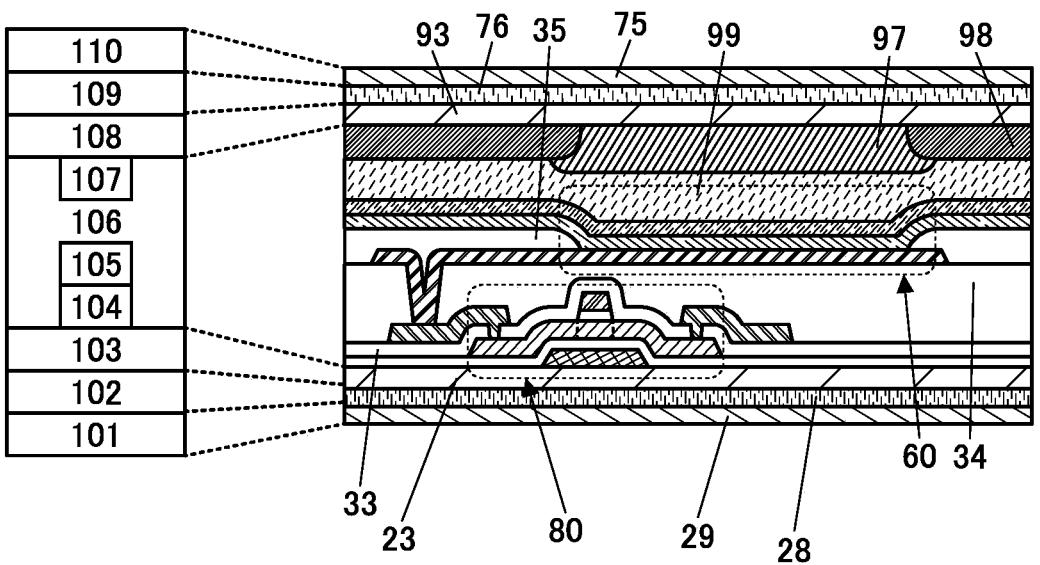

7100

7200

7300

7400

FIG. 20A
FIG. 20B
FIG. 20C
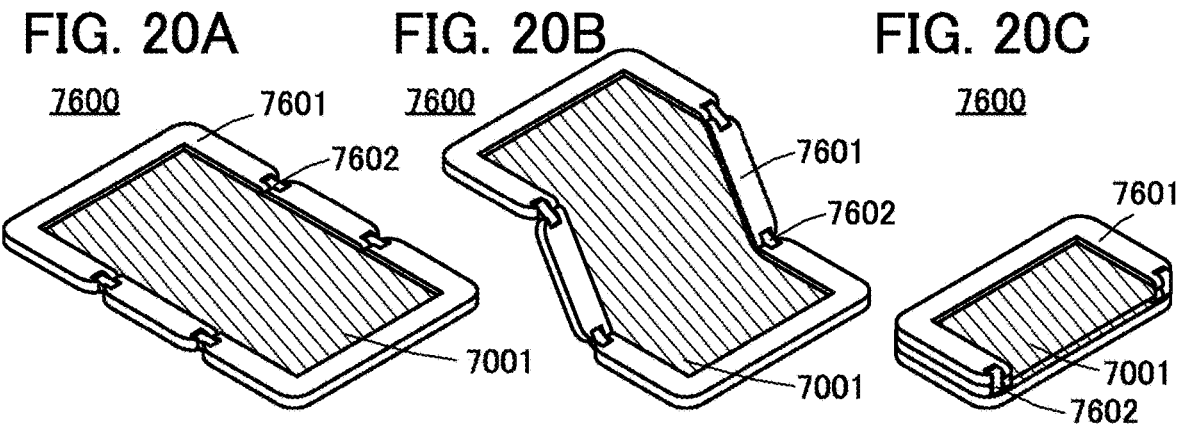
7600    7601
7602
7001
7600    7601
7602
7001
7600
7601
7001
7602
FIG. 20D
FIG. 20E
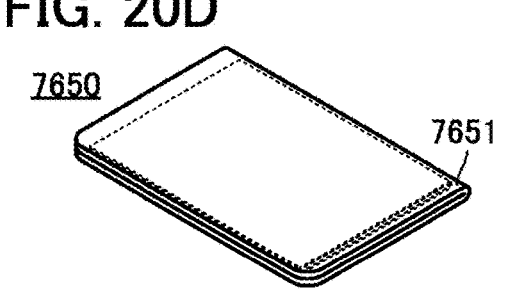
7650    7651
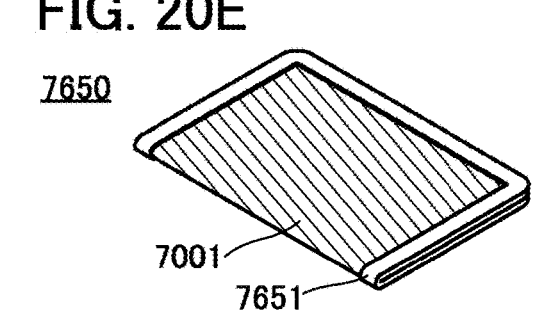
7650
7001
7651
FIG. 20F
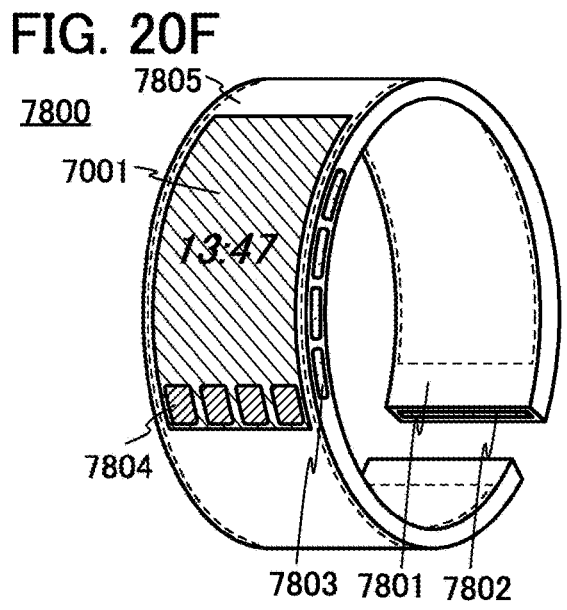
7805
7800
7001
13:47
7804
7803  7801  7802

| Color filter substrate | | |
|---|---|---|
| R | G | B |
| Resin | | |
| Semi-reflective Cathode | | |
| Electron Transport\Injection Layer | | |
| Red Emission Layer | | |
| Green Emission Layer | | |
| Intermediate Layer | | |
| Blue Emission Layer | | |
| Hole Injection\Transport Layer | | |
| Reflective Anode with resonant cavity | | |
| FET substrate | | |

←Color filter

FIG. 25B

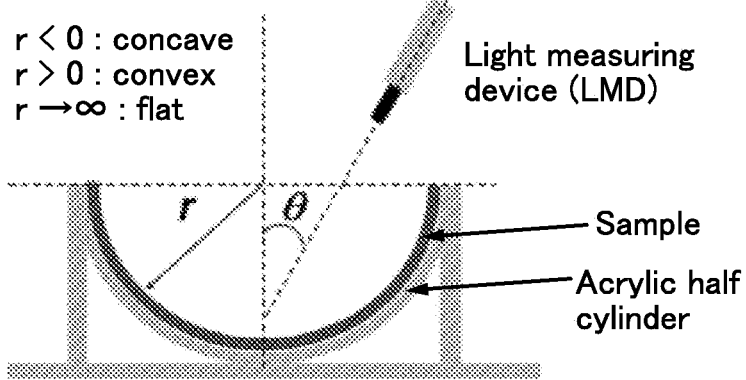

r < 0 : concave
r > 0 : convex
r → ∞ : flat

Light measuring device (LMD)

Sample

Acrylic half cylinder

BENDABLE DISPLAY DEVICE

TECHNICAL FIELD

One embodiment of the present invention relates to a method for manufacturing a display device. One embodiment of the present invention relates to a display device, a display module, and an electronic device. In particular, one embodiment of the present invention relates to a flexible display device and a manufacturing method thereof.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

Display devices using organic electroluminescence (EL) elements or liquid crystal elements have been known. Other examples of display devices include a light-emitting device provided with a light-emitting element such as a light-emitting diode (LED), and electronic paper performing display with an electrophoretic method or the like.

A basic structure of the organic EL element is a structure in which a layer containing a light-emitting organic compound is provided between a pair of electrodes. By voltage application to this element, light emission can be obtained from the light-emitting organic compound. By using such an organic EL element, a display device that is thin and lightweight and has high contrast and low power consumption can be obtained. Furthermore, a display device using an organic EL element can be easily made flexible. In a flexible display device, a design and a function that are difficult to achieve for a display device using a hard substrate can be achieved.

Patent Document 1 discloses a flexible light-emitting device using an organic EL element.

REFERENCE

Patent Document

[Patent Document 1] Japanese Published Patent Application No. 2014-197522

SUMMARY OF THE INVENTION

Problems to be Solved by the Invention

Display devices using organic EL elements have been expected to be applied to electronic devices with foldable display portions, for example. In order to achieve foldable display devices, it is important to improve the resistance to bending of display devices. Furthermore, for commercialization, display devices need to resist not one bending but a plurality of bendings (specifically, 50,000 times or more, preferably, 100,000 times or more).

Moreover, in Patent Document 1, a method for separating a semiconductor element, a light-emitting element, and the like formed over a glass substrate with a separation layer therebetween and transferring them to a flexible substrate has been studied. In this method, the formation temperature of the semiconductor element can be increased, and an extremely highly reliable display device can be manufactured. For practical use, flexible display devices have been required to be manufactured with high yield.

An object of one embodiment of the present invention is to provide a display device that can be repeatedly bent with a small radius of curvature. An object of one embodiment of the present invention is to provide a highly reliable display device. An object of one embodiment of the present invention is to provide a display device less likely to be broken. An object of one embodiment of the present invention is to reduce the thickness or weight of a display device. An object of one embodiment of the present invention is to provide an electronic device including a flexible display portion or a display portion having a curved surface.

An object of one embodiment of the present invention is to provide a method for manufacturing a display device with high yield. An object of one embodiment of the present invention is to provide a method for manufacturing a display device with high mass productivity. An object of one embodiment of the present invention is to provide a method for manufacturing a display device at low cost.

Note that the descriptions of these objects do not disturb the existence of other objects. One embodiment of the present invention does not need to achieve all the objects. Other objects can be derived from the descriptions of the specification, the drawings, and the claims.

One embodiment of the present invention is a method for manufacturing a display device as follows: forming a separation layer over a support substrate; forming, over the separation layer, an inorganic insulating layer including a first portion and a second portion; forming, over the inorganic insulating layer, a display element to be overlapped with the first portion; forming, over the inorganic insulating layer, a connection electrode to be overlapped with the second portion; sealing the display element; separating the support substrate and the inorganic insulating layer using the separation layer; attaching a substrate to the inorganic insulating layer to be overlapped with the first portion and etching the second portion using the substrate as a mask to expose the connection electrode.

One embodiment of the present invention is a method for manufacturing a display device as follows: forming a separation layer over a support substrate; forming, over the separation layer, an inorganic insulating layer including a first portion and a second portion; forming, over the inorganic insulating layer, a transistor and a display element electrically connected to the transistor to be overlapped with the first portion; forming, over the inorganic insulating layer, a connection electrode to be overlapped with the second portion; sealing the display element, separating the support substrate and the inorganic insulating layer using the separation layer; attaching a substrate to the inorganic insulating layer to be overlapped with the first portion; and etching the second portion using the substrate as a mask to expose the connection electrode. The connection electrode is preferably formed using a material and a process which are the same as those of at least one of electrodes included in the transistor. The transistor preferably includes a metal oxide in a semiconductor layer. Alternatively, the transistor preferably includes silicon in a semiconductor layer.

The substrate preferably has a stacked-layer structure of a substrate having flexibility and a protective layer. The substrate having flexibility is positioned closer to the inorganic insulating layer than the protective layer is. The substrate having flexibility and the protective layer are preferably separated from each other after the connection electrode is exposed.

It is preferable that by a dry etching method, the second portion be etched and a sidewall including a reaction product be formed on a side surface of the substrate.

The display element is preferably a light-emitting element including a light-emitting organic compound.

The separation layer preferably includes a resin or tungsten.

One embodiment of the present invention is a display device including a first substrate, a first inorganic insulating layer, a display element, a connection electrode, and a second inorganic insulating layer. The first substrate overlaps with the display element with the first inorganic insulating layer interposed therebetween. The display element is positioned between the first inorganic insulating layer and the second inorganic insulating layer. A surface of the display device on the first substrate side includes a first region in which the first substrate and the first inorganic insulating layer are not provided. The first region includes a portion where the connection electrode is exposed. At least part of a side surface of the first substrate is provided with a sidewall. The sidewall includes one or both of an element contained in the first inorganic insulating layer and halogen. In addition, a transistor is preferably included. The transistor includes an electrode and an insulating layer. The electrode includes the same material as the connection electrode. The insulating layer covers at least part of the connection electrode and at least part of the electrode. The first region further includes a portion where the insulating layer is exposed. The portion of the first region where the connection electrode is exposed preferably includes a portion more projected than the portion of the first region where the insulating layer is exposed.

One embodiment of the present invention is a display module including the display device and a circuit board. The connection electrode is electrically connected to the circuit board.

One embodiment of the present invention is a display device including a first substrate, a first inorganic insulating layer over the first substrate, a display element over the first inorganic insulating layer, a second inorganic insulating layer over the display element, and a second substrate over the second inorganic insulating layer. The display device has a function of being repeatedly bendable. When the display device is bent, the rate of the strain applied to the first substrate is lower than or equal to the rate of the strain at the yield point of the first substrate. When the display device is bent, the rate of the strain applied to the second substrate is lower than or equal to the rate of the strain at the yield point of the second substrate. It is preferable that a fold be not generated in the case where a test is performed in which the display device is repeatedly bent 100,000 times under conditions where the rate of the strain applied to the first substrate is lower than or equal to the rate of the strain at the yield point of the first substrate, and the rate of the strain applied to the second substrate is lower than or equal to the rate of the strain at the yield point of the second substrate. It is preferable that the display device further include a transistor. The transistor preferably includes a metal oxide in a semiconductor layer. Alternatively, the transistor preferably includes silicon in a semiconductor layer. The display element is preferably a light-emitting element including a light-emitting organic compound.

One embodiment of the present invention is an electronic device including a display device, a circuit board, and at least any one of an antenna, a battery, a housing, a camera, a speaker, a microphone, and an operation button. The display device includes a first substrate, a first inorganic insulating layer over the first substrate, a display element over the first inorganic insulating layer, a second inorganic insulating layer over the display element, and a second substrate over the second inorganic insulating layer. The display device has a function of being repeatedly bendable. When the display device is bent, the rate of the strain applied to the first substrate is lower than or equal to the rate of the strain at the yield point of the first substrate. When the display device is bent, the rate of the strain applied to the second substrate is lower than or equal to the rate of the strain at the yield point of the second substrate. It is preferable that the display device further include a connection electrode. A surface of the display device on the first substrate side includes a first region in which the first substrate and the first inorganic insulating layer are not provided, and the first region includes a portion where the connection electrode is exposed. The connection electrode is electrically connected to the circuit board. At least part of a side surface of the first substrate is provided with a sidewall. The sidewall includes one or both of an element contained in the first inorganic insulating layer and halogen.

According to one embodiment of the present invention, a display device that can be repeatedly bent with a small radius of curvature can be provided. According to one embodiment of the present invention, a highly reliable display device can be provided. According to one embodiment of the present invention, a display device less likely to be broken can be provided. According to one embodiment of the present invention, a display device can be reduced in the thickness and weight. According to one embodiment of the present invention, an electronic device including a flexible display portion or a display portion having a curved surface can be provided.

According to one embodiment of the present invention, a method for manufacturing a display device with high yield can be provided. According to one embodiment of the present invention, a method for manufacturing a display device with high mass productivity can be provided. According to one embodiment of the present invention, a method for manufacturing a display device at low cost can be provided.

Note that the descriptions of the effects do not disturb the existence of other effects. One embodiment of the present invention does not need to have all the effects. Other effects can be derived from the descriptions of the specification, the drawings, and the claims.

BRIEF DESCRIPTION OF THE DRAWINGS

FIG. 2 Cross-sectional views illustrating an example of a method for manufacturing a display device.

FIG. 5 Cross-sectional views illustrating examples of a method for manufacturing a display device.

FIG. 6 Cross-sectional views illustrating an example of a method for manufacturing a display device.

Figures 8A, 8B:
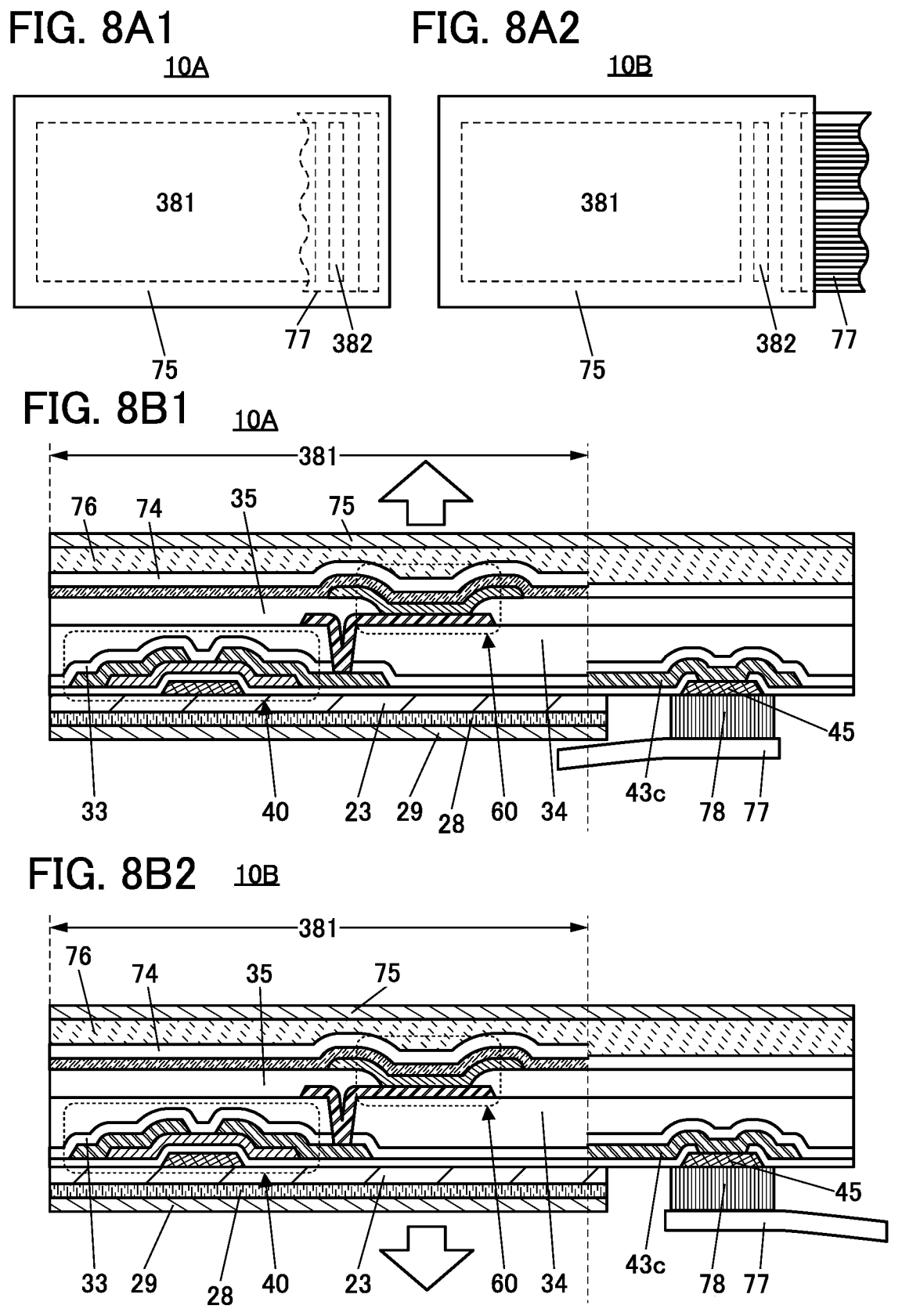

FIG. 8 (A1) (A2) Top views illustrating examples of a display device. (B1) (B2) Cross-sectional views illustrating examples of a display device.

FIG. 11 Cross-sectional views illustrating an example of a method for manufacturing a display device.

FIG. 12 Cross-sectional views illustrating an example of a method for manufacturing a display device.

FIG. 13 Cross-sectional views illustrating an example of a method for manufacturing a display device.

FIG. 14 Cross-sectional views illustrating an example of a method for manufacturing a display device.

FIG. 16(A) A top view illustrating an example of a display device (B) A cross-sectional view illustrating an example of a display device. (C) (D) Cross-sectional views illustrating examples of a transistor.

FIG. 17 Cross-sectional views illustrating examples of a display device.

FIG. 20 Diagrams illustrating examples of an electronic device.

FIG. 21 Diagrams illustrating examples of an electronic device.

FIG. 25(A) A diagram illustrating a display panel in Example 2. (B) A schematic view of a measurement method in Example 2.

MODE FOR CARRYING OUT THE INVENTION

Figure 1:
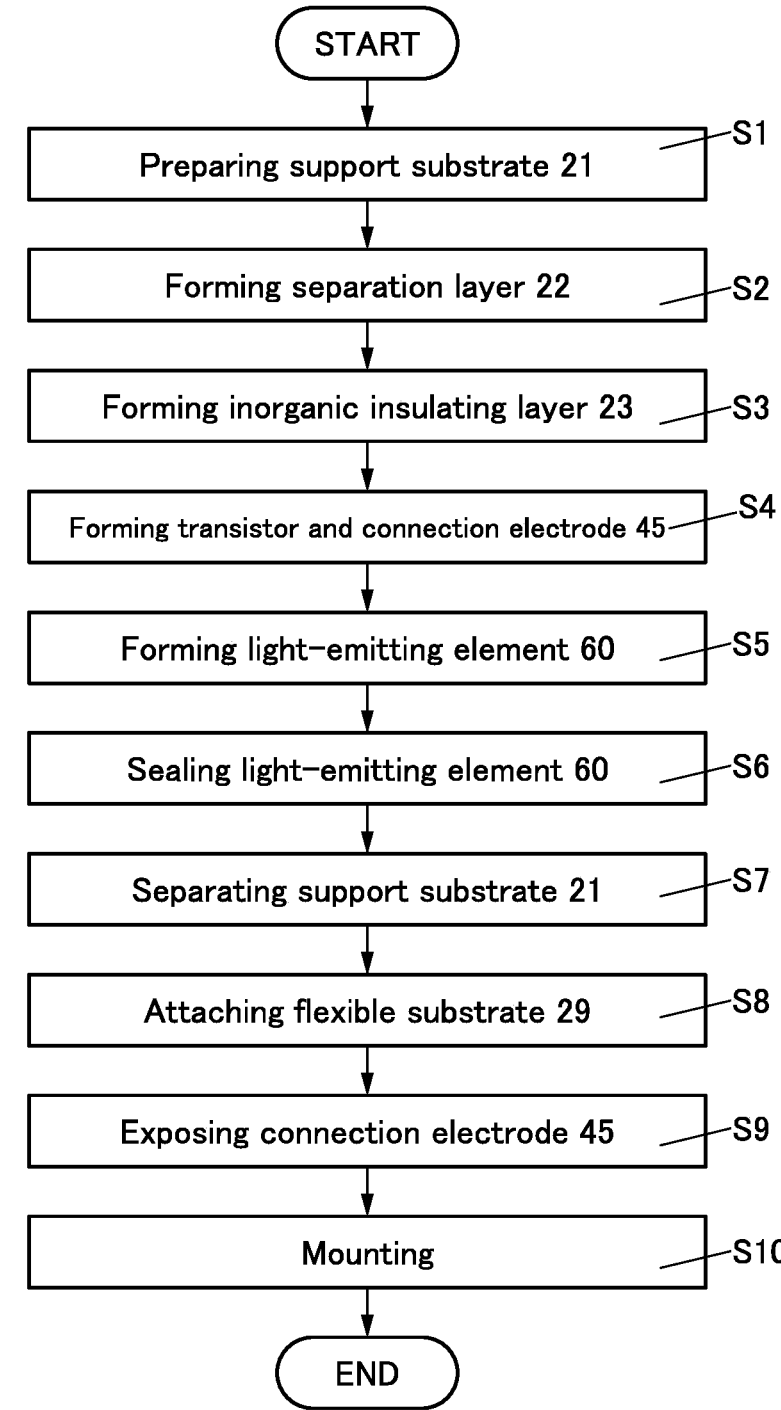
FIG. 1 A flow chart showing an example of a method for manufacturing a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in the structures of the invention described below, the same portions or portions having similar functions are denoted by the same reference numerals in different drawings, and description of such portions is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Embodiment 1

In this embodiment, a display device of one embodiment of the present invention and a manufacturing method thereof will be described with reference to FIG. 1 to FIG. 16.

In this embodiment, a display device that includes a transistor and an organic EL element (also referred to as an active matrix organic EL display device) will be described as an example. The display device can be a flexible device by using a flexible material for a substrate. Note that one embodiment of the present invention is not limited to a light-emitting device, a display device, and an input/output device (e.g., a touch panel) that include organic EL elements, and one embodiment of the present invention can be applied to a variety of devices such as a semiconductor device, a light-emitting device, a display device, and an input/output device that include other functional elements.

In a method for manufacturing a display device of this embodiment, a layer to be separated is formed over a support substrate with a separation layer interposed therebetween, and then the support substrate and the layer to be separated are separated using the separation layer, and then the layer to be separated is transferred to a substrate having flexibility (also referred to as a flexible substrate).

Specifically, first, the separation layer is formed over the support substrate, an inorganic insulating layer is formed over the separation layer, and a display element and a connection electrode are formed over the inorganic insulating layer. The display element is formed to overlap with a first portion of the inorganic insulating layer. The connection electrode is formed to overlap with a second portion of the inorganic insulating layer. In the inorganic insulating layer, the first portion and the second portion are portions different from each other.

After that, the display element is sealed. Examples of a method for sealing the display element include a method for covering the display element with an insulating film having a high barrier property (also referred to as film sealing) and a method for attaching a sealing substrate using an adhesive (also referred to as solid sealing). As the insulating film having a high barrier property, an inorganic insulating film is preferable. As the sealing substrate, a flexible substrate is preferable, and examples thereof include a resin film or a stainless steel foil (SUS foil).

It is preferable that in sealing the display element, an insulating film having a high barrier property or a sealing substrate be provided over an entire region of the support substrate over which the layer to be separated is formed. When the insulating film or the sealing substrate is partly provided, easiness of separation varies depending on places, and a portion that is less likely to be separated and a portion that cannot be separated might be generated. Therefore, the entire formation region of the layer to be separated is sealed, whereby the yield of separation of the support substrate can be increased. Meanwhile, not only the display element but also the connection electrode is sealed, therefore, a step of exposing the connection electrode is needed.

In this embodiment, after the support substrate and the layer to be separated are separated from each other using the separation layer, a substrate is attached to the inorganic insulating layer to be overlapped with the first portion of the inorganic insulating layer, and the second portion of the inorganic insulating layer is etched using the substrate as a mask to expose the connection electrode.

In many cases, when etching is performed from a separation surface side, the number of layers to be removed can be reduced as compared to the case where etching is performed from the opposite surface side, so that the process can be shortened.

Since the substrate can be used as the mask, a mask for exposing the connection electrode does not need to be separately prepared, leading to a reduction in cost.

The exposed connection electrode can be used as a rear electrode, a through electrode, an external connection terminal, or the like. The connection electrode can be electrically connected to a circuit board such as a flexible printed circuit (FPC), for example.

In the case where a surface on which the connection electrode is exposed is opposite to a display surface, a region with which an FPC or the like overlaps is less likely to be limited in a display device; therefore, space-saving is possible when the display device is incorporated into an electronic device, and thus the electronic device can have a smaller size.

The substrate attached to the inorganic insulating layer preferably has a stacked-layer structure of a flexible substrate and a protective layer. The flexible substrate is positioned closer to the inorganic insulating layer than the protective layer is. For each of the flexible substrate and the protective layer, a resin film or the like can be used. With the protective layer, in steps of etching and transferring the inorganic insulating layer, for example, damage or contamination of the flexible substrate can be inhibited. The protective layer is preferably separated from the display device after the manufacturing process is completed. Thus, a damage or contamination of a surface of the display device can be easily removed, so that the display device can be made thin.

Note that in an etching step using a dry etching method, a reaction product might be attached to a side surface of the flexible substrate. The reaction product includes one or both of an element contained in the inorganic insulating layer and halogen, for example. For example, a sidewall containing the reaction product is formed on the side surface of the flexible substrate in some cases. The sidewall includes an inorganic material, and therefore, an effect of inhibiting entry of impurities such as water into the flexible substrate is obtained in some cases.

A method for manufacturing the display device of one embodiment of the present invention will be specifically described below.

Note that thin films included in the display device (e.g., insulating films, semiconductor films, or conductive films) can be formed by a sputtering method, a chemical vapor deposition (CVD) method, a vacuum evaporation method, a pulsed laser deposition (PLD) method, an atomic layer deposition (ALD) method, or the like. As the CVD method, a plasma-enhanced chemical vapor deposition (PECVD) method or a thermal CVD method may be used. As an example of the thermal CVD method, a metal organic chemical vapor deposition (MOCVD) method may be used.

Thin films included in the display device (e.g., insulating films, semiconductor films, or conductive films) can be formed by a method such as spin coating, dipping, spray coating, ink-jetting, dispensing, screen printing, offset printing, a doctor knife, slit coating, roll coating, curtain coating, or knife coating.

When thin films included in the display device are processed, a lithography method or the like can be used for the processing. Alternatively, island-shaped thin films may be formed by a film formation method using a blocking mask. Alternatively, a nanoimprinting method, a sandblasting method, a lift-off method, or the like may be used for the processing of the thin films. Examples of the photolithography method include a method in which a resist mask is formed over a thin film to be processed, the thin film is processed by etching or the like, and the resist mask is removed, and a method in which a photosensitive thin film is formed and then exposed to light and developed to be processed into a desired shape.

In the case of using light in the lithography method, any of an i-line (a wavelength of 365 nm), a g-line (a wavelength of 436 nm), and an h-line (a wavelength of 405 nm), or combined light of any of them can be used for light exposure. Besides, ultraviolet light, KrF laser light, ArF laser light, or the like can be used. Furthermore, light exposure may be performed by liquid immersion light exposure technique. Furthermore, as the light used for the light exposure, extreme ultra-violet (EUV) light or X-rays may be used. Furthermore, instead of the light used for the light exposure, an electron beam can also be used. It is preferable to use extreme ultra-violet light, X-rays, or an electron beam because extremely minute processing can be performed. Note that in the case of performing light exposure by scanning with a beam such as an electron beam, a photomask is not needed.

For etching of the thin films, a dry etching method, a wet etching method, a sandblasting method, or the like can be used.

Manufacturing Method Example 1

FIG. 1 shows a flow of a method for manufacturing a display device. Cross-sectional views illustrating the method for manufacturing a display device are shown in FIG. 2 to FIG. 7. Cross-sectional views of display devices that can be manufactured using the manufacturing method example 1 are shown in FIG. 8 and FIG. 9.

[Step S1: Preparing Support Substrate 21]

First, a support substrate 21 is prepared (FIG. 2(A)).

The support substrate 21 has stiffness high enough for easy transfer and has resistance to temperatures applied during the manufacturing process. Examples of a material that can be used for the support substrate 21 include glass, quartz, ceramics, sapphire, a resin, a semiconductor, a metal, and an alloy. Examples of the glass include alkali-free glass, barium borosilicate glass, and aluminoborosilicate glass.

[Step S2: Forming Separation Layer 22]

Next, a separation layer 22 is formed over the support substrate 21 (FIG. 2(A)).

In this step, a material is selected that would cause separation at the interface between the support substrate 21 and the separation layer 22, the interface between the separation layer 22 and the inorganic insulating layer 23, or in the separation layer 22 when the support substrate 21 and the layer to be separated are separated from each other.

The separation layer 22 can be formed using one of or both an organic material and an inorganic material.

Examples of an inorganic material that can be used for the separation layer 22 include a metal, an alloy, and a compound (e.g., a metal oxide, a metal nitride, or a metal oxynitride), that contain an element selected from tungsten, molybdenum, titanium, tantalum, niobium, nickel, cobalt, zirconium, zinc, ruthenium, rhodium, palladium, osmium, iridium, and silicon. A crystal structure of a layer containing silicon may be amorphous, microcrystal, or polycrystal.

In the case where an inorganic material is used, the thickness of the separation layer 22 is greater than or equal to 1 nm and less than or equal to 1000 nm, preferably greater than or equal to 10 nm and less than or equal to 200 nm, more preferably greater than or equal to 10 nm and less than or equal to 100 nm.

In the case where an inorganic material is used, the separation layer 22 can be formed by, for example, a sputtering method, a CVD method, an ALD method, or an evaporation method.

Examples of an organic material that can be used for the separation layer 22 include a polyimide resin, an acrylic resin, an epoxy resin, a polyamide resin, a polyimide-amide resin, a siloxane resin, a benzocyclobutene-based resin, and a phenol resin.

In the case where an organic material is used, the thickness of the separation layer 22 is preferably greater than or equal to 0.01 μm and less than 10 μm, further preferably greater than or equal to 0.1 μm and less than or equal to 5 μm, still further preferably greater than or equal to 0.1 μm and less than or equal to 3 μm. When the thickness of the separation layer 22 is within the above range, the manufacturing cost can be reduced. Note that the thickness of the separation layer 22 is not limited thereto, and may be greater than or equal to 10 μm, for example, greater than or equal to 10 μm and less than or equal to 200 μm.

In the case where an organic material is used, examples of a method for forming the separation layer 22 include spin coating, dipping, spray coating, ink-jetting, dispensing, screen printing, offset printing, a doctor knife, a slit coater, a roll coater, a curtain coater, and a knife coater.

[Step 3: Forming Inorganic Insulating Layer 23]

Next, an inorganic insulating layer 23 is formed over the separation layer 22 (FIG. 2(B)).

The inorganic insulating layer 23 can be used as a barrier layer that prevents diffusion of impurities contained in the support substrate 21 and the separation layer 22 into a transistor and a display element formed later.

As the inorganic insulating layer 23, for example, an inorganic insulating film such as a silicon nitride film, a silicon oxynitride film, a silicon oxide film, a silicon nitride oxide film, an aluminum oxide film, or an aluminum nitride film can be used. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

In particular, a silicon nitride film, a silicon nitride oxide film, and an aluminum oxide film are preferable as the inorganic insulating layer 23 because of a high barrier property.

Note that in this specification and the like, an oxynitride refers to a material whose oxygen content is higher than the nitrogen content as for the composition, and a nitride oxide refers to a material whose nitrogen content is higher than the oxygen content as for the composition.

An inorganic insulating film is preferably formed at high temperatures because the film can have higher density and a higher barrier property as the film formation temperature is higher.

The substrate temperature during the formation of the inorganic insulating layer 23 is preferably higher than or equal to room temperature (25° C.) and lower than or equal to 350° C., further preferably higher than or equal to 100° C. and lower than or equal to 300° C.

[Step 4: Forming Transistor and Connection Electrode 45]

Next, a transistor 40 and a connection electrode 45 are formed over the inorganic insulating layer 23 (FIGS. 2(C) to 2(E)).

There is no particular limitation on the structure of the transistor included in the display device. For example, a planar transistor, a staggered transistor, or an inverted staggered transistor may be used. A transistor structure of either a top-gate structure or a bottom-gate structure may be used. Gate electrodes may be provided above and below a channel.

As a semiconductor layer of the transistor, a metal oxide layer functioning as an oxide semiconductor layer is preferably used. Using a semiconductor material having a wider band gap and a lower carrier density than silicon, such as an oxide semiconductor, is preferable because a current in an off state of a transistor can be reduced.

Note that the structure of the display device of one embodiment of the present invention is not limited to the structure in which a semiconductor layer of the transistor includes a metal oxide. For example, in the display device of one embodiment of the present invention, silicon can be used in the semiconductor layer of the transistor. As silicon, amorphous silicon or crystalline silicon can be used. As crystalline silicon, microcrystalline silicon, polycrystalline silicon, single crystal silicon, and the like can be given. As silicon, low-temperature polysilicon (LTPS) is preferably used. Polycrystalline silicon, e.g., LTPS, can be formed at a lower temperature than single crystal silicon and has higher field effect mobility and higher reliability than amorphous silicon.

Here, the case where a bottom-gate transistor including an oxide semiconductor layer 44 is manufactured as the transistor 40 is shown.

Specifically, first, a conductive layer 41 and the connection electrode 45 are formed over the inorganic insulating layer 23 (FIG. 2(C)). The conductive layer 41 and the connection electrode 45 can be formed in such a manner that a conductive film is deposited, a resist mask is formed, the conductive film is etched, and the resist mask is removed.

The connection electrode 45 is preferably formed using a material and a process which are the same as those of at least one of electrodes used for the transistor, the display element, and the like, included in the display device. Thus, increases in the number of steps, the number of masks, and the like in manufacturing the display device can be inhibited.

For the conductive layers included in the display device, a single-layer structure or a stacked-layer structure of any of metals such as aluminum, titanium, chromium, nickel, copper, yttrium, zirconium, molybdenum, silver, tantalum, and tungsten or an alloy containing any of these metals as its main component can be used. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or indium tin oxide containing silicon may be used. Alternatively, a semiconductor such as an oxide semiconductor or polycrystalline silicon whose resistance is lowered by adding an impurity element, for example, or silicide such as nickel silicide may be used. A film including graphene may be used as well. The film including graphene can be formed, for example, by reducing a film including graphene oxide. A semiconductor such as an oxide semiconductor containing an impurity element may be used. Alternatively, the conductive layers may be formed using a conductive paste of silver, carbon, copper, or the like or a conductive polymer such as polythiophene. A conductive paste is preferable because it is inexpensive. A conductive polymer is preferable because it is easily applied.

Next, an insulating layer 32 is formed (FIG. 2(C)). For the insulating layer 32, a material that can be used for the inorganic insulating layer 23 can be used.

Next, an opening is formed in a portion of the insulating layer 32 that overlaps with the connection electrode 45 (see FIG. 2(D)). Atop surface of the connection electrode 45 is exposed by formation of the opening.

Next, the oxide semiconductor layer 44 is formed (FIG. 2(E)). The oxide semiconductor layer 44 can be formed in the following manner an oxide semiconductor film is formed, a resist mask is formed, the oxide semiconductor film is etched, and then the resist mask is removed.

The substrate temperature at the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be formed using one or both of an inert gas and an oxygen gas. Note that there is no particular limitation on the flow rate of oxygen (the partial pressure of oxygen) at the time of depositing the oxide semiconductor film. However, to obtain a transistor having high field-effect mobility, the flow rate ratio of oxygen (the partial pressure of oxygen) at the time of depositing the oxide semiconductor film is preferably higher than or equal to 0% and lower than or equal to 30%, further preferably higher than or equal to 5% and lower than or equal to 30%, still further preferably higher than or equal to 7% and lower than or equal to 15%.

The oxide semiconductor film preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained. The oxide semiconductor film preferably includes, for example, a film represented by an In-M-Zn-based oxide that contains at least indium, zinc, and M (aluminum, gallium, yttrium, tin, boron, silicon, titanium, iron, nickel, germanium, zirconium, molybdenum, lanthanum, cerium, neodymium, hafnium, tantalum, tungsten, or magnesium). In particular, an In-M-Zn-based oxide layer (M is Al, Ga, Y, or Sn) is preferably used, and an In—Ga—Zn-based oxide layer is more preferably used.

Note that here, an In—Ga—Zn-based oxide means an oxide containing In, Ga, and Zn as its main components and there is no limitation on the ratio of In to Ga and Zn. Furthermore, a metal element in addition to In, Ga, and Zn may be contained.

The energy gap of the oxide semiconductor is preferably 2 eV or more, further preferably 2.5 eV or more, and still further preferably 3 eV or more. The use of such an oxide semiconductor having a wide energy gap leads to a reduction in the off-state current of a transistor.

In the case where the oxide semiconductor is an In-M-Zn-based oxide, it is preferable that the atomic ratio of metal elements of a sputtering target used to deposit a film of the In-M-Zn-based oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the deposited semiconductor layer varies from the above atomic ratios of metal elements of the sputtering targets in a range of ±40%.

The oxide semiconductor film can be formed by a sputtering method. Alternatively, a PLD method, a PECVD method, a thermal CVD method, an ALD method, or a vacuum evaporation method, for example, may be used.

Next, a conductive layer 43a, a conductive layer 43b, and a conductive layer 43c are formed (FIG. 2(E)). The conductive layer 43a, the conductive layer 43b, and the conductive layer 43c can be formed in the following manner: a conductive film is formed, a resist mask is formed, the conductive film is etched, and then the resist mask is removed. The conductive layer 43a and the conductive layer 43b are connected to the oxide semiconductor layer 44. The conductive layer 43c is connected to the connection electrode 45.

Note that during the processing of the conductive layer 43a and the conductive layer 43b, part of the oxide semiconductor layer 44 that is not covered by the resist mask might be etched to be thin.

In the above manner, the transistor 40 can be fabricated (FIG. 2(E)). In the transistor 40, part of the conductive layer 41 functions as a gate, part of the insulating layer 32 functions as a gate insulating layer, and the conductive layer 43a and the conductive layer 43b each function as a source or a drain.

Figure 3A:
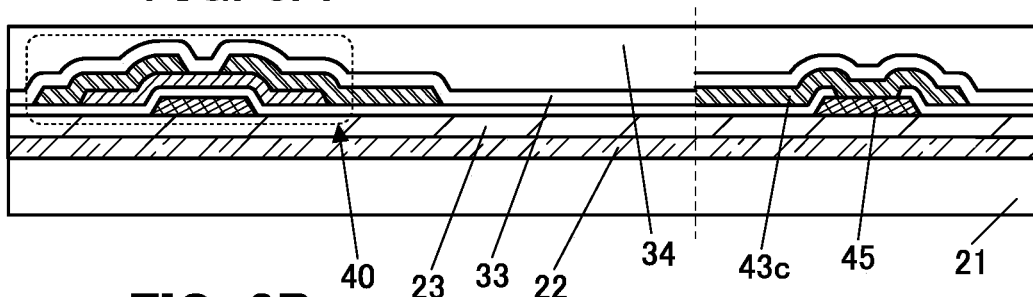
FIG. 3 Cross-sectional views illustrating an example of a method for manufacturing a display device.

Next, an insulating layer 33 covering the transistor 40 is formed (FIG. 3(A)). The insulating layer 33 can be formed using a method similar to that of the inorganic insulating layer 23.

It is preferable to use an oxide insulating film, such as a silicon oxide film or a silicon oxynitride film, formed in an oxygen-containing atmosphere for the insulating layer 33. An insulating film with low oxygen diffusibility and oxygen permeability, such as a silicon nitride film, is preferably stacked over the silicon oxide film or the silicon oxynitride film. The oxide insulating film formed in an oxygen-containing atmosphere can easily release a large amount of oxygen by heating. When a stack including such an oxide insulating film that releases oxygen and an insulating film with low oxygen diffusibility and oxygen permeability is heated, oxygen can be supplied to the oxide semiconductor layer 44. As a result, oxygen vacancies in the oxide semiconductor layer 44 can be filled and defects at the interface between the oxide semiconductor layer 44 and the insulating layer 33 can be repaired, leading to a reduction in defect levels. Accordingly, an extremely highly reliable display device can be manufactured.

Then, an insulating layer 34 is formed over the insulating layer 33 (FIG. 3(A)). The insulating layer 34 is a layer having a surface where a display element is to be formed later, and thus preferably functions as a planarization layer. The insulating layer 34 can be formed using an organic insulating film of a polyimide resin, an acrylic resin, an epoxy resin, a polyamide resin, a polyimide-amide resin, a siloxane resin, a benzocyclobutene-based resin, a phenol resin, or the like. For the insulating layer 34, an inorganic insulating film that can be used for the inorganic insulating layer 23 can also be used.

Next, an opening reaching the conductive layer 43*b* is formed in the insulating layer 34 and the insulating layer 33.

[Step S5: Forming Light-Emitting Element 60]

Next, a light-emitting element 60 is formed as a display element. First, a conductive layer 61 is formed to fill the opening formed in the insulating layer 34 and the insulating layer 33, and the conductive layer 43*b* and the conductive layer 61 are connected to each other (FIG. 3(B)). Part of the conductive layer 61 functions as a pixel electrode of the light-emitting element 60. The conductive layer 61 can be formed in the following manner: a conductive film is formed, a resist mask is formed, the conductive film is etched, and then the resist mask is removed.

Figure 3B:
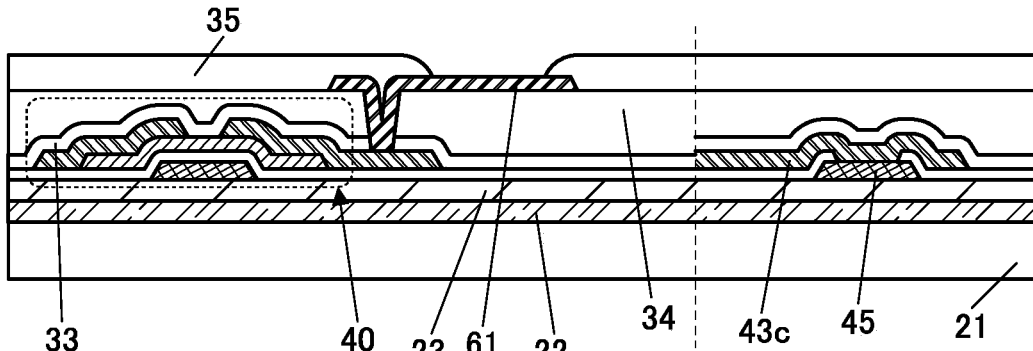

Subsequently, an insulating layer 35 that covers an end portion of the conductive layer 61 is formed (FIG. 3(B)). For the insulating layer 35, a material that can be used for the insulating layer 34 can be used.

Figure 3C:
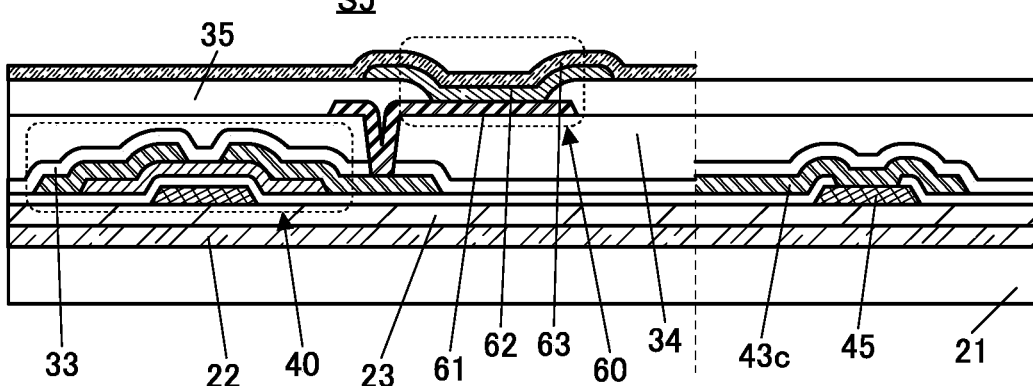

Then, an EL layer 62 and a conductive layer 63 are formed (FIG. 3(C)). Part of the conductive layer 63 functions as a common electrode of the light-emitting element 60.

The EL layer 62 can be formed by an evaporation method, a coating method, a printing method, a discharge method, or the like. In the case where the EL layer 62 is separately formed for each individual pixel, it can be formed by an evaporation method using a blocking mask such as a metal mask, an ink-jet method, or the like. In the case of not forming the EL layer 62 for each individual pixel, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

In the above manner, the light-emitting element 60 can be formed (FIG. 3(C)). The light-emitting element 60 has a structure where the conductive layer 61 part of which functions as the pixel electrode, the EL layer 62, and the conductive layer 63 part of which functions as the common electrode are stacked.

Although an example where a top-emission light-emitting element is formed as the light-emitting element 60 is described here, one embodiment of the present invention is not limited thereto.

The light-emitting element may be a top-emission, bottom-emission, or dual-emission light-emitting element. A conductive film that transmits visible light is used for the electrode through which light is extracted. Moreover, a conductive film that reflects visible light is preferably used for the electrode through which light is not extracted.

[Step S6: Sealing Light-Emitting Element 60]

Figure 3D:
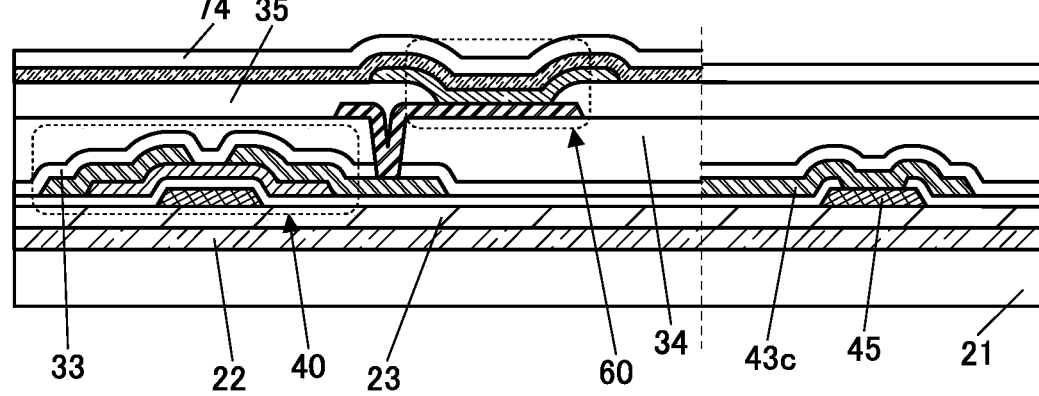

Next, an insulating layer 74 is preferably formed so as to cover the conductive layer 63 (FIG. 3(D)). The insulating layer 74 functions as a protective layer that prevents diffusion of impurities such as water into the light-emitting element 60. The light-emitting element 60 is sealed with the insulating layer 74.

The insulating layer 74 preferably has a structure including an inorganic insulating film having a high barrier property that can be used for the inorganic insulating layer 23, for example. A stack including an inorganic insulating film and an organic insulating film can also be used.

The light-emitting element 60 is positioned between the inorganic insulating layer 23 and the insulating layer 74. A top surface and a bottom surface of the light-emitting element 60 are interposed between the inorganic insulating films, whereby entry of impurities into the light-emitting element 60 can be suppressed. Thus, a longer lifetime of the light-emitting element 60 becomes possible, and a display device in which deterioration of display using the light-emitting element 60 is less likely to be caused can be achieved. The transistor 40 is also positioned between the inorganic insulating layer 23 and the insulating layer 74. Therefore, entry of impurities into the transistor 40 can also be suppressed. Thus, variation in electrical characteristics of the transistor 40 can be suppressed.

The inorganic insulating film preferably has high moisture resistance through which water is less likely to be diffused and transmitted. The inorganic insulating film through which one or both of hydrogen and oxygen are less likely to be diffused and transmitted is further preferable. Thus, the inorganic insulating film can serve as a barrier film. Diffusion of impurities from the outside into the transistor 40 and the light-emitting element 60 can be effectively suppressed, so that a highly reliable display device can be achieved.

Each of the inorganic insulating layer 23 and the insulating layer 74 can be formed by a CVD method (e.g., a PECVD method), a sputtering method, an ALD method, or the like.

The EL layer 62 included in a light-emitting element 60 has low heat resistance. Therefore, the insulating layer 74 formed after the formation of the light-emitting element 60 is preferably formed at a relatively low temperature, typically, lower than or equal to 100° C. Each of a PECVD method, a sputtering method, and an ALD method enables film formation at a low temperature and is thus suitable for formation of the insulating layer 74.

The inorganic insulating layer 23 formed before the formation of the light-emitting element 60 can be formed at a high temperature. By making substrate temperature during film formation high (e.g., higher than or equal to 100° C. and lower than or equal to 350° C.), a dense film with a high barrier property can be formed. Each of a PECVD method, a sputtering method, and an ALD method also enables formation at a high temperature and thus is suitable for formation of the inorganic insulating layer 23.

A CVD method is preferable because the deposition rate is high and a thick film is formed easily.

In an ALD method, a film is deposited by setting the pressure in a deposition chamber to an atmospheric pressure or a reduced pressure, sequentially introducing source gases for reaction (e.g., an oxidizer and a precursor) into the deposition chamber, and repeatedly introducing the source gases. A first source gas is adsorbed onto a formation surface to form a first layer, and a second source gas is introduced into the deposition chamber, which causes a reaction between the first layer and the second source gas, so that a second layer is stacked over the first layer; thus, a thin film is formed. The sequence of the source gas introduction is controlled and repeated a plurality of times until a desired thickness is obtained, whereby a thin film with excellent step coverage can be formed.

Note that as the ALD method, there are a thermal ALD method which utilizes thermal reaction as means for activating part or the whole of the source gases, and a PEALD (Plasma Enhanced ALD) method which utilizes plasma reaction. The film formation temperature of the PEALD method can be lower than that of the thermal ALD method. In the PEALD method, a film can be deposited at about room temperature. Furthermore, an effect of increasing the deposition rate and an effect of increasing the density of the film, for example, are obtained.

As the inorganic insulating layer 23 or the insulating layer 74, two or more insulating films formed by different film deposition methods may be stacked.

It is preferable that as the insulating layer 74, first, a first inorganic insulating film be formed by a sputtering method and a second inorganic insulating film be formed by an ALD method, for example.

A film formed by a sputtering method contains less impurities and has higher density than a film formed by an ALD method. The film formed by an ALD method has higher step coverage and is less likely to be influenced by the shape of a deposition surface than the film formed by a sputtering method.

The first inorganic insulating film contains less impurities and has high density. The second inorganic insulating film is formed so as to cover a portion which is not sufficiently covered with the first inorganic insulating film by the influence of a step of the formation surface. Thus, an insulating layer capable of further reducing diffusion of water or the like can be formed as compared with the case where only one of the inorganic insulating films is formed.

Specifically, it is preferable to stack an aluminum oxide film formed by a sputtering method and an aluminum oxide film formed by an ALD method.

The thickness of the inorganic insulating film formed by a sputtering method is preferably greater than or equal to 50 nm and less than or equal to 1000 nm, further preferably greater than or equal to 100 nm and less than or equal to 300 nm.

The thickness of the inorganic insulating film formed by an ALD method is preferably greater than or equal to 1 nm and less than or equal to 100 nm, further preferably greater than or equal to 5 nm and less than or equal to 50 nm.

The water vapor transmission rate of each of the inorganic insulating layer 23 and the insulating layer 74 is lower than $1\times10^{-2}$ g/(m²·day), preferably lower than or equal to $5\times10^{-3}$ g/(m²·day), further preferably lower than or equal to $1\times10^{-4}$ g/(m²·day), still further preferably lower than or equal to $1\times10^{-5}$ g/(m²·day), yet further preferably lower than or equal to $1\times10^{-6}$ g/(m²·day). The lower the water vapor transmission rate is, the more diffusion of water from the outside into the transistor and the light-emitting element can be reduced.

The thickness of each of the inorganic insulating layer 23 and the insulating layer 74 is preferably greater than or equal to 1 nm and less than or equal to 1000 nm, further preferably greater than or equal to 50 nm and less than or equal to 500 nm, still further preferably greater than or equal to 100 nm and less than or equal to 300 nm. The thickness of the insulating layer is preferably smaller because the thinner the whole display device can be. The thinner the insulating layer is, the more throughput is improved, so that the productivity of the display device can be improved.

Thus, a top surface and a bottom surface of the transistor 40 and the top surface and the bottom surface of the light-emitting element 60 are interposed between the inorganic insulating films, whereby entry of impurities into the transistor 40 and the light-emitting element 60 can be suppressed, leading to an increase in the reliability of the display device.

Figure 4A:
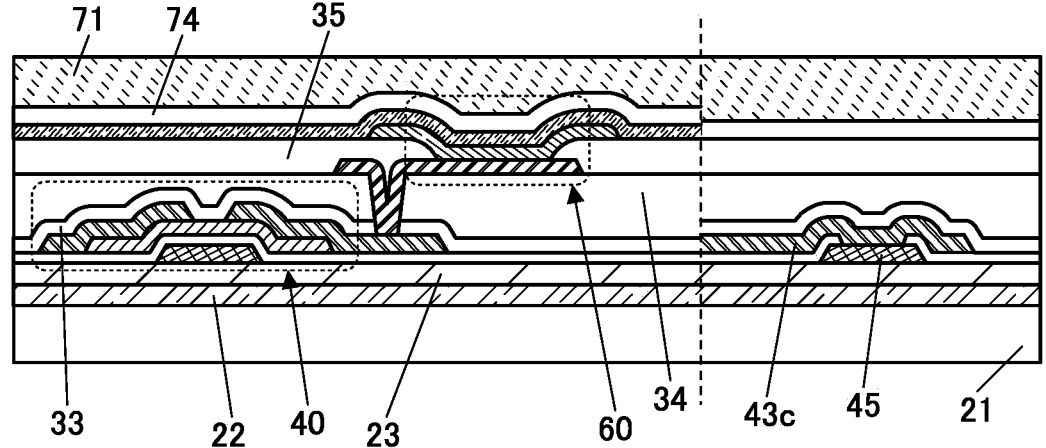
FIG. 4 Cross-sectional views illustrating an example of a method for manufacturing a display device.
Figure 4B:
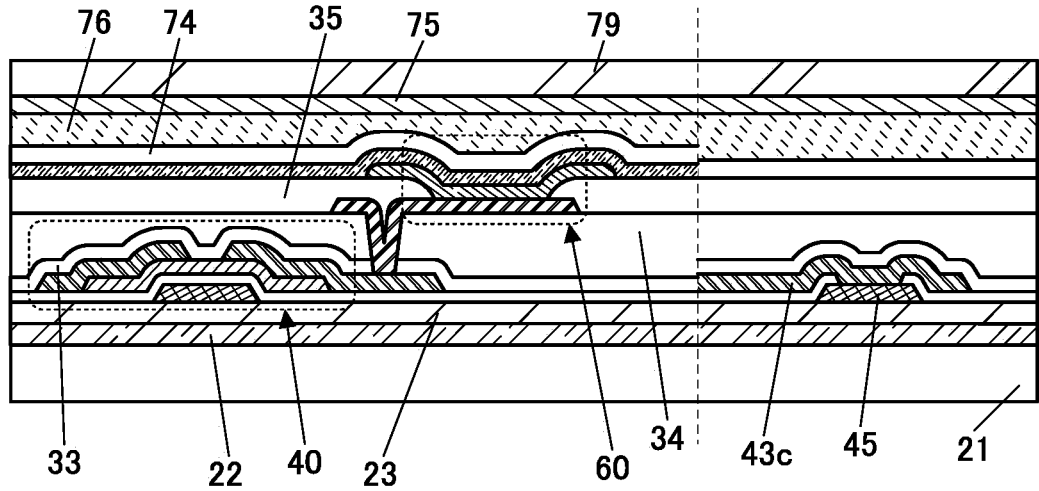

Furthermore, a protective layer is preferably formed over the insulating layer 74 (FIGS. 4(A) and 4(B)). The protective layer can be used as a layer positioned on the outermost surface of the display device.

As described above, in this manufacturing method example 1, in order to form a top-emission light-emitting element, the insulating layer 74 and the protective layer are positioned on the side through which light from the light-emitting element 60 is extracted. Thus, each of the insulating layer 74 and the protective layer preferably has a high transmitting property with respect to visible light. In the case where light is not extracted from the protective layer side, for example, in the case where a bottom-emission light-emitting element is formed, there is no limitation on the transmitting property with respect to visible light of the insulating layer 74 and the protective layer, and thus, the range of choices for materials is widened. Note that in the case where the protective layer has a high barrier property, the insulating layer 74 is not necessarily provided.

The above-described organic insulating film that can be used as the insulating layer 34 is preferably used as the protective layer 71 illustrated in FIG. 4(A) because a damage or a crack on a surface of the display device can be suppressed.

FIG. 4(B) illustrates an example in which a flexible substrate 75 is attached to the insulating layer 74 with an adhesive layer 76. As the flexible substrate 75, a resin film, an SUS foil, or the like can be favorably used. A protective layer 79 is preferably stacked on the outer surface of the flexible substrate 75.

For example, one of protective films that interposes a resin film can be used as the protective layer 79, and the resin film can be used as the flexible substrate 75. First, the one protective film is detached to expose one surface of the resin film (the flexible substrate 75), and the exposed surface and the insulating layer 74 are attached to each other using the adhesive layer 76. Without detachment of the other protective film (the protective layer 79) at this stage, the next step is preferably performed. This can prevent damage or contamination to the surface of the resin film (the flexible substrate 75) in the subsequent step. In FIG. 4(B), the flexible substrate 75 and the protective layer 79 are illustrated.

As the adhesive layer 76, any of a variety of curable adhesives such as a reactive curable adhesive, a thermosetting adhesive, an anaerobic adhesive, and a photo-curable adhesive such as an ultraviolet curable adhesive can be used. Alternatively, an adhesive sheet or the like may be used.

For the flexible substrate 75, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. For the flexible substrate 75, any of a variety of materials such as glass, quartz, resin, metal (e.g., aluminum, copper, or nickel), an alloy (SUS, aluminum alloy, or the like), and a semiconductor that are thin enough to have flexibility may be used.

In the following steps, description will be made using the case of employing the structure of FIG. 4(B) as an example.

The protective layers used for sealing the display element, such as the insulating layer 74 and the protective layer 71 illustrated in FIG. 4(A) and the insulating layer 74, the adhesive layer 76, the flexible substrate 75, and the protective layer 79 illustrated in FIG. 4(B), are preferably provided to overlap with the connection electrode 45. Thus, the separability of an entire formation region of the layer to be separated can be made more uniform, so that the yield in a later separation step can be increased.

Moreover, it is preferable that the protective layers used for sealing the display element be provided to an edge portion of the display device or the vicinity thereof because the distance of moisture entry to a display portion becomes long, leading to higher reliability. When there is a step on a surface where the protective layer is formed, in the case where an IC or an FPC is pressure-bonded in a mounting step in Step S10 described later, force may be locally applied to part of the display device, resulting in generation of a crack. Accordingly, it is preferable that the protective layer be provided over the entire formation region of the layer to be separated and a surface of the display device where the protective layer is provided be flat. As a material of these protective layers, a material with a small coefficient of linear expansion and a high glass transition temperature is preferable.

[Step S7: Separating Support Substrate 21]

Next, the support substrate 21 and the inorganic insulating layer 23 are separated from each other using the separation layer 22. As illustrated in FIGS. 5(A) to 5(C), a separation interface varies depending on the structures and the separation methods of the support substrate 21, the separation layer 22, and the inorganic insulating layer 23.

FIG. 5(A) illustrates an example in which separation occurs between the support substrate 21 and the separation layer 22. The separation layer 22 remaining on the inorganic insulating layer 23 side is preferably removed. By removing the separation layer 22, the thickness of the display device can be made small and the flexibility can be increased. Note that it is preferable that the separation layer 22 do not need to be removed because the removal step can be omitted.

FIG. 5(B) illustrates an example in which separation occurs in the separation layer 22. Part of the separation layer 22 (the separation layer 22a) remains on the inorganic insulating layer 23 side, and part of the separation layer 22 (the separation layer 22b) remains on the support substrate 21 side.

FIG. 5(C) illustrates an example in which separation occurs between the separation layer 22 and the inorganic insulating layer 23.

In the following steps, description will be made using the case of employing the structure of FIG. 5(C) as an example.

For example, a separation trigger can be formed by inserting a sharp instrument such as a knife between the separation layer 22 and the inorganic insulating layer 23. Alternatively, a separation trigger may be formed by irradiating part of the separation layer 22 or an entire surface thereof with laser light. Then, physical force (e.g., treatment for separating with a human hand, a jig, a roller, or the like) is gently applied to the area where the separation trigger is formed in a direction substantially perpendicular to the attached surfaces, so that the inorganic insulating layer 23 can be separated from the separation layer 22 without damage.

Here, separation is caused in such a manner that liquid containing water such as water or an aqueous solution is added to the separation interface and the liquid penetrates into the separation interface, so that the separability can be improved. Furthermore, an adverse effect of static electricity caused during the separation on the transistor 40 or the light-emitting element 60 (e.g., breakage of a semiconductor element by static electricity) can be suppressed.

Alternatively, depending on the structure of the separation layer 22 and the conditions of the laser light irradiation, separation of the inorganic insulating layer 23 from the separation layer 22 starts only by laser light irradiation, and the separation can proceed to the entire inorganic insulating layer 23 by irradiation of an entire surface with laser light.

As the laser light, light having a wavelength at least part of which passes through the support substrate 21 and is absorbed by the separation layer 22 is selected and used. The laser light is preferably light in a wavelength range from visible light to ultraviolet light. For example, light having a wavelength of greater than or equal to 200 nm and less than or equal to 400 nm, preferably light having a wavelength of greater than or equal to 250 nm and less than or equal to 350 nm can be used. In particular, an excimer laser having a wavelength of 308 nm is preferably used because the productivity is high. The excimer laser is preferable because the excimer laser is used also for laser crystallization of LTPS, so that the existing LTPS manufacturing line apparatus can also be used and new capital investment is not necessary. Furthermore, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running costs can be reduced compared with those of an excimer laser. Further alternatively, a pulsed laser such as a picosecond laser may be used.

In the case where linear laser light is used as the laser light, scanning is performed with the laser light and a region to be separated is entirely irradiated with the laser light by relatively moving the support substrate 21 and a light source.

[Step S8: Attaching Flexible Substrate 29]

Next, with an adhesive layer 28, the flexible substrate 29 is attached to the inorganic insulating layer 23 exposed by the separation (FIG. 6(A)). A protective layer 27 is preferably stacked on an outer surface of the flexible substrate 29.

A material that can be used for the adhesive layer 76 can be used for the adhesive layer 28. For the flexible substrate 29, a material that can be used for the flexible substrate 75 can be used. For the protective layer 27, a material that can be used for the protective layer 79 can be used.

The flexible substrate 29 (and the protective layer 27) also functions as a mask at the time of exposing the connection electrode 45. Thus, the flexible substrate 29 (and the protective layer 27) is provided so as not to overlap with at least part of the connection electrode 45.

[Step S9: Exposing Connection Electrode 45]

Next, the inorganic insulating layer 23 is etched using the flexible substrate 29 (and the protective layer 27) as a mask to expose the connection electrode 45 (FIG. 6(B)). For the etching, either a dry etching method or a wet etching method can be used.

At this time, the thickness of the display device is extremely small, and it is preferable that fix the display device to a hard substrate 82 using a buffer layer 81 and proceed with the etching. As the buffer layer 81, an adhesive material is preferable, and for example, an adhesive sheet can be used. Examples of a material of the adhesive sheet include an acrylic-based material, a urethane-based material, and a silicone-based material. For the hard substrate 82, a material that can be used for the support substrate 21 can be used. It is preferable that the protective layer 79 and the buffer layer 81 be easily separated from each other. For example, it is preferable that a silicone sheet be used as the buffer layer 81 and a glass substrate be used as the hard substrate 82.

Note that in the case where the separation layer 22 remains, both the separation layer 22 and the inorganic insulating layer 23 are removed to expose the connection electrode 45.

In the case where an inorganic material is used for the separation layer 22, the separation layer 22 is preferably etched in a manner similar to that of the inorganic insulating layer 23. Either the dry etching method or wet etching method can be used.

In the case where an organic material such as a resin is used for the separation layer 22, ashing using oxygen plasma is preferable. Ashing has advantages such as high controllability, good in-plane uniformity, and high suitability for treatment using a large-sized substrate.

The inorganic insulating layer 23 and the insulating layer 32 are preferably formed using different materials because in that case etching is easily stopped at an interface between the inorganic insulating layer 23 and the insulating layer 32 or in the vicinity thereof. In the case where one of or both the inorganic insulating layer 23 and the insulating layer 32 have a stacked-layer structure, layers in contact with each other are preferably formed using different materials.

Note that not only the inorganic insulating layer 23 but also part of the insulating layer 32 may be etched. In an enlarged view of a portion including the connection electrode 45 illustrated in FIG. 6(B), an example in which the insulating layer 32 is partly removed, and an exposed surface of the connection electrode 45 is more projected than an exposed surface of the insulating layer 32 is illustrated.

In an enlarged view of a portion including the flexible substrate 29 in FIG. 6(B), an example in which a sidewall 85 is provided in contact with a side surface of the flexible substrate 29 and aside surface of the adhesive layer 28 is illustrated. In the etching step using a dry etching method, a reaction product is attached to one of or both the side surface of the flexible substrate 29 and the side surface of the adhesive layer 28 in some cases. For example, the reaction product includes at least one of an element contained in the inorganic insulating layer 23 and an element contained in the etching gas. Examples of these elements are carbon, sulfur, halogen, silicon, oxygen, and nitrogen. In the display device, the sidewall 85 including the reaction products is formed in some cases. The sidewall 85 includes an inorganic material and thus has an effect of preventing impurities such as water from entering the flexible substrate 29 and the adhesive layer 28 in some cases.

[Step S10: Mounting]

Figure 7:
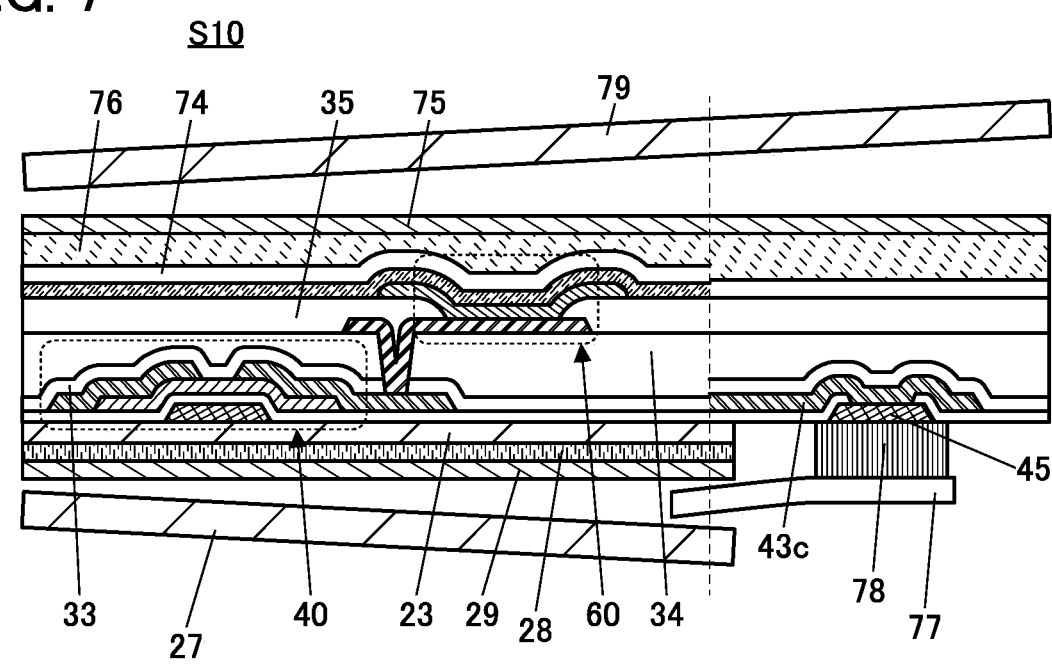
FIG. 7 A cross-sectional view illustrating an example of a method for manufacturing a display device.

Then, the connection electrode 45 and an FPC 77 are electrically connected to each other through a connector 78 (FIG. 7).

As the connector 78, any of a variety of anisotropic conductive films (ACF), anisotropic conductive pastes (ACP), and the like can be used.

It is preferable that the connection electrode 45 be more projected than the insulating layer 32 as illustrated in FIG. 6(B) because in that case an anchor effect is generated when the connector 78 is connected. Thus, adhesion between the connector 78 and the connection electrode 45 can be improved.

Through the above steps, the display device using an oxide semiconductor for the transistor and employing a separate coloring method for an EL element can be manufactured.

It is preferable that the protective layer 79 and the protective layer 27 be separated as illustrated in FIG. 7.

In the manufacturing method example 1, an example using a top-emission light-emitting element is described.

The flexible substrate 75 side is the display surface side, and thus if an external connection terminal is exposed from the flexible substrate 75 side and electrically connected to the FPC 77, the FPC 77 is not allowed to overlap with the display region and an area in which the FPC 77 overlaps with the display device is limited. In contrast, the connection electrode 45 can be easily exposed on a surface on the side opposite to the display surface by using one embodiment of the present invention. The FPC 77 can be placed on the side opposite to the display surface, and thus a space for bending the FPC 77 in incorporating the display device in an electronic device can be saved, which enables the electronic device to be smaller.

As described above, by using the manufacturing method example 1, the yield in the separation step in manufacturing the display device can be increased, and the connection electrode can be easily exposed.

[Structure Example 1 of Display Device]

Next, a display device 10A to a display device 10D which can be manufactured using the manufacturing method example 1 will be described.

FIG. 8(A1) is a top view of the display device 10A and FIG. 8(B1) is a cross-sectional view of the display device 10A.

The display device 10A includes a display portion 381 and a driver circuit portion 382. The display surface is a surface on the flexible substrate 75 side, and the FPC 77 is connected to a surface on a side opposite to the display surface. Thus, the FPC 77 can be provided to overlap with the display portion 381.

A cross-sectional structure of the display device 10A illustrated in FIG. 8(B1) is similar to that of the structure manufactured by the manufacturing method example 1, and thus, detailed description thereof is omitted.

FIG. 8(A2) is a top view of the display device 10B, and FIG. 8(B2) is a cross-sectional view of the display device 10B.

The display device 10B includes the display portion 381 and the driver circuit portion 382. The display surface is a surface on the flexible substrate 29 side, and the FPC 77 is connected to the display surface side. Thus, the FPC 77 is provided not to overlap with the display portion 381.

The cross-sectional structure of the display device 10B illustrated in FIG. 8(B2) is substantially similar to that of the structure manufactured by the manufacturing method example 1, and thus, detailed description thereof is omitted. The display portion 381 of the display device 10B is different from the display portion 381 of the display device 10A in that a structure that blocks light, such as the transistor 40, is not provided at a position overlapping with a light-emitting region of the light-emitting element 60.

Figure 9A:
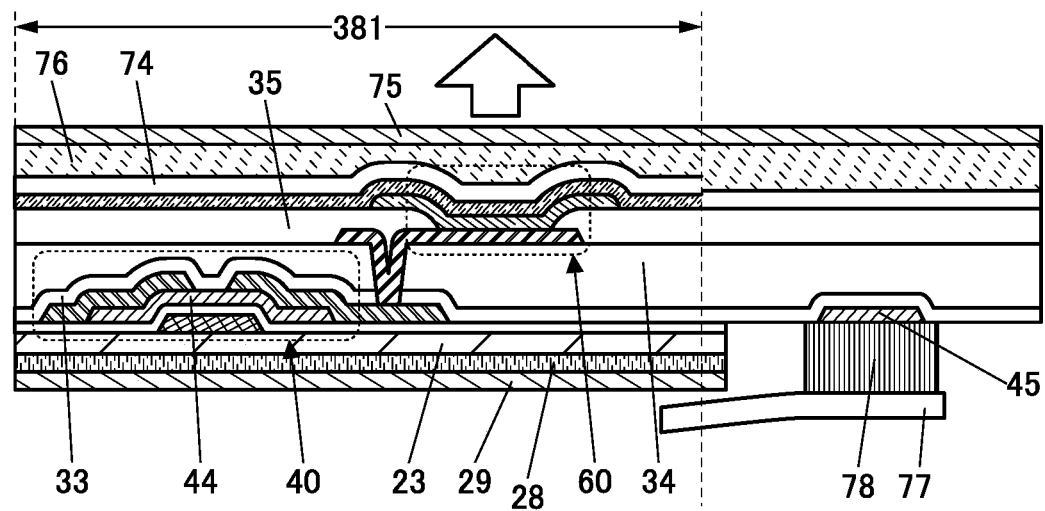
FIG. 9 Cross-sectional views illustrating examples of a display device.

FIG. 9(A) is across-sectional view of the display device 10C. A top view of the display device 10C is similar to that of the display device 10A (FIG. 8(A1)).

A display surface of the display device 10C is a surface on the flexible substrate 75 side, and the FPC 77 is connected to a surface on aside opposite to the display surface. Thus, the FPC 77 can be provided to overlap with the display portion 381.

The display device 10C is different from the display device 10A in that an oxide conductive layer is used as the connection electrode 45.

The connection electrode 45 of the display device 10C can be formed using a material and a process which are the same as those of the oxide semiconductor layer 44. For example, an oxide semiconductor layer used as the connection electrode 45 and an oxide semiconductor layer used as the oxide semiconductor layer 44 of the transistor are formed using the same material and the same step. After that, the resistance of only the oxide semiconductor layer used as the connection electrode 45 is reduced (it can also be said that it is made into an oxide conductive layer).

An oxide semiconductor is a semiconductor material whose resistance can be controlled by at least one of oxygen vacancies in the film and the concentration of impurities (typically, hydrogen, water, and the like) in the film. Thus, the resistivity of the oxide semiconductor layer or the oxide conductive layer can be controlled by selecting treatment for increasing at least one of oxygen vacancies and impurity concentration in the oxide semiconductor layer, or treatment for reducing at least one of oxygen vacancies and impurity concentration in the oxide semiconductor layer.

Specifically, the resistivity of the oxide semiconductor can be controlled by plasma treatment. For example, it is possible to employ plasma treatment using a gas containing one or more kinds selected from a rare gas (He, Ne, Ar, Kr, Xe), hydrogen, boron, phosphorus, and nitrogen. For example, plasma treatment can be performed in an Ar atmosphere, a mixed gas atmosphere of Ar and nitrogen, a mixed gas atmosphere of Ar and hydrogen, an ammonia atmosphere, a mixed gas atmosphere of Ar and ammonia, or a nitrogen atmosphere. Thus, the carrier density of the oxide semiconductor layer can be increased and the resistivity can be reduced.

Alternatively, hydrogen, boron, phosphorus, or nitrogen is introduced to an oxide semiconductor layer by an ion implantation method, an ion doping method, a plasma immersion ion implantation method, or the like, so that the resistivity of the oxide semiconductor layer can be reduced.

Alternatively, a method in which a film containing at least one of hydrogen and nitrogen is formed in contact with the oxide semiconductor layer and at least one of hydrogen and nitrogen is diffused from the film into the oxide semiconductor layer can be employed. Thus, the carrier density of the oxide semiconductor layer can be increased and the resistivity can be reduced.

Hydrogen included in the oxide semiconductor layer reacts with oxygen bonded to a metal atom to be water, and also causes oxygen vacancy in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, the carrier density of the oxide semiconductor layer can be increased and the resistivity can be reduced.

In the case where heat treatment is performed in the manufacturing process of the display device, oxygen is released from the oxide semiconductor layer by heating the oxide semiconductor layer, so that oxygen vacancies might be increased. Thus, the resistivity of the oxide semiconductor layer can be reduced.

Note that such an oxide conductive layer formed using an oxide semiconductor layer can also be referred to as an oxide semiconductor layer having a high carrier density and a low resistance, an oxide semiconductor layer having conductivity, or an oxide semiconductor layer having high conductivity.

Figure 9B:
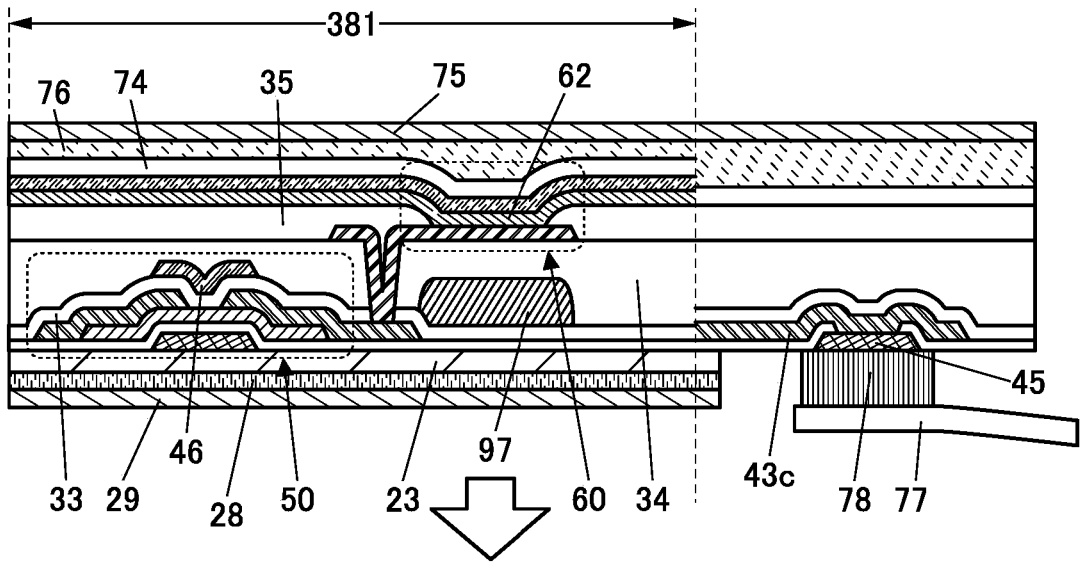

FIG. 9(B) is a cross-sectional view of a display device 10D. Atop view of the display device 10D is similar to that of the display device 10B (FIG. 8(A2)).

A display surface of the display device 10D is a surface on the flexible substrate 29 side, and the FPC 77 is connected to the display surface side. Thus, the FPC 77 is provided not to overlap with the display portion 381.

The display device 10D is different from the display device 10B in that the EL layer 62 is not separately formed for each individual pixel and a coloring layer 97 is provided for a pixel of each color. The display device 10D is also different from the display device 10B in that the transistor 40 is not included and a transistor 50 is included. The transistor 50 includes a conductive layer 46 functioning as a back gate, in addition to the components of the transistor 40.

<Manufacturing Method Example 2>

Figure 10:
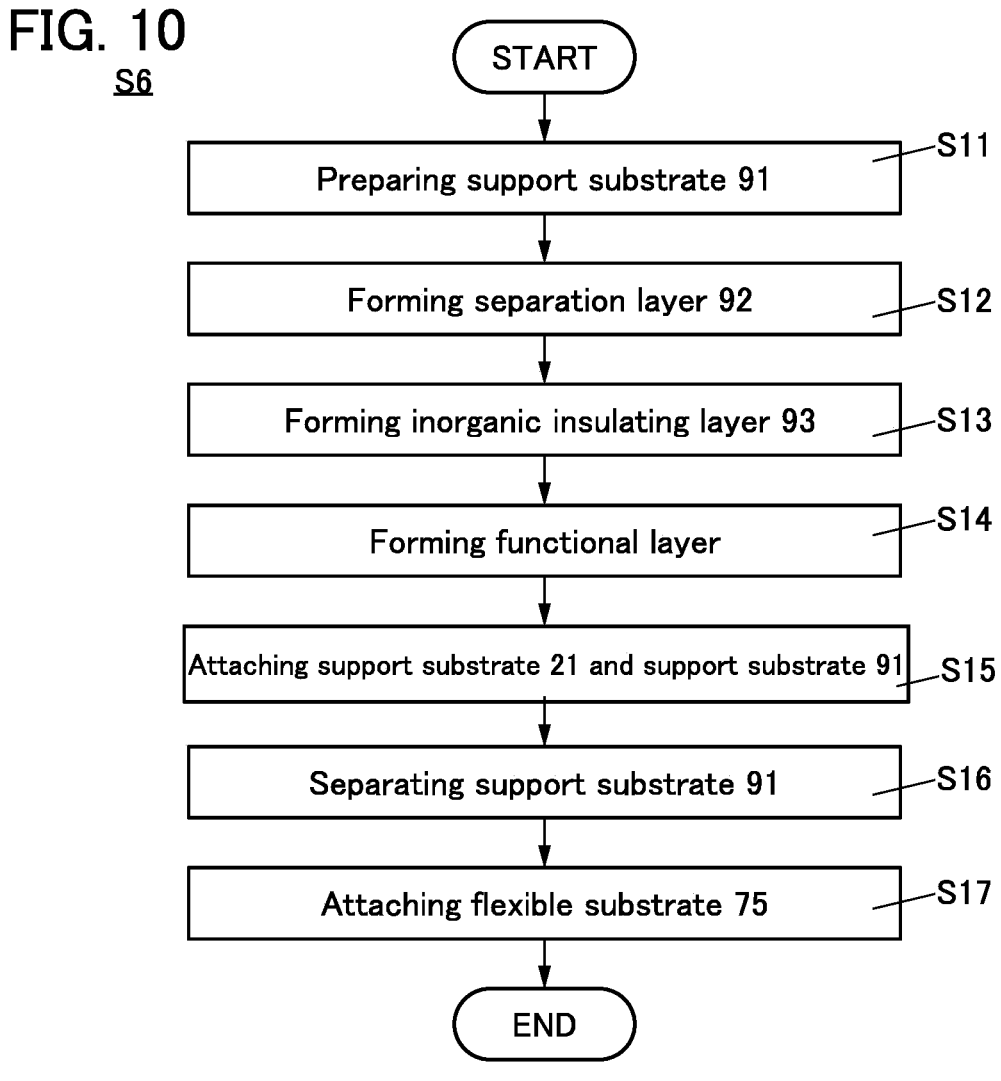
FIG. 10 A flow chart showing an example of a method for manufacturing a display device.

FIG. 1 is a flow chart of a method for manufacturing a display device. FIG. 10 shows a detailed flow of Step S6 in FIG. 1. Cross-sectional views illustrating the method for manufacturing a display device are shown in FIG. 11 to FIG. 15. Cross-sectional views of a display device that can be manufactured using the manufacturing method example 2 are shown in FIG. 16. Note that detailed description of portions similar to those in the manufacturing method example 1 is omitted.

[Step S1: Preparing Support Substrate 21]

First, the support substrate 21 is prepared (FIG. 11(A)).

[Step S2: Forming Separation Layer 22]

Next, the separation layer 22 is formed over the support substrate 21 (FIG. 11(A)).

[Step 3: Forming Inorganic Insulating Layer 23]

Next, the inorganic insulating layer 23 is formed over the separation layer 22 (FIG. 11(B)).

The steps from Step S1 to Step S3 are similar to those of the manufacturing method example 1, and thus, detailed description thereof is omitted.

[Step 4: Forming Transistor and Connection Electrode 45]

Next, a transistor 80 and the connection electrode 45 are formed over the inorganic insulating layer 23 (FIGS. 11(C) to 11(E)).

Here, the case where a transistor including the oxide semiconductor layer 44 and two gates is manufactured as the transistor 80 is shown.

Specifically, first, the conductive layer 41 and the connection electrode 45 are formed over the inorganic insulating layer 23 (FIG. 11(C)). The conductive layer 41 and the connection electrode 45 can be formed in such a manner that a conductive film is deposited, a resist mask is formed, the conductive film is etched, and the resist mask is removed.

Next, the insulating layer 32 is formed (FIG. 11(C)). For the insulating layer 32, the materials that can be used for the inorganic insulating layer 23 can be used.

Then, the oxide semiconductor layer 44 is formed (FIG. 11(C)). The oxide semiconductor layer 44 can be formed in the following manner: an oxide semiconductor film is formed, a resist mask is formed, the oxide semiconductor film is etched, and then the resist mask is removed.

Then, an insulating layer 47 and the conductive layer 46 are formed (FIG. 11(C)). For the insulating layer 47, the materials that can be used for the inorganic insulating layer 23 can be used. The insulating layer 47 and the conductive layer 46 can be formed in the following manner an insulating film to be the insulating layer 47 and a conductive film to be the conductive layer 46 are formed, a resist mask is formed, the insulating film and the conductive film are etched, and the resist mask is removed.

Next, the insulating layer 33 that covers the oxide semiconductor layer 44, the insulating layer 47, and the conductive layer 46 is formed (FIG. 11(C)). For the insulating layer 33, the materials that can be used for the inorganic insulating layer 23 can be used.

Next, an opening is formed in a portion of the insulating layer 32 and the insulating layer 33 that overlap with the connection electrode 45 (FIG. 1*l*(D)). The top surface of the connection electrode 45 is exposed by providing the opening. Furthermore, openings are also provided in portions of the insulating layer 33 that overlap with the oxide semiconductor layer 44.

Next, the conductive layer 43*a*, the conductive layer 43*b*, and the conductive layer 43*c* are formed (FIG. 11(E)). The conductive layer 43*a*, the conductive layer 43*b*, and the conductive layer 43*c* can be formed in the following manner: a conductive film is formed, a resist mask is formed, the conductive film is etched, and then the resist mask is removed. The conductive layer 43*a* and the conductive layer 43*b* are electrically connected to the oxide semiconductor layer 44 through the corresponding openings in the insulating layer 33. The conductive layer 43*c* is connected to connection electrode 45.

In the above manner, the transistor 80 can be fabricated (FIG. 11(E)). In the transistor 80, part of the conductive layer 41 serves as a gate, part of the insulating layer 32 serves as a gate insulating layer, part of the insulating layer 47 serves as a gate insulating layer, and part of the conductive layer 46 serves as a gate. The oxide semiconductor layer 44 includes a channel formation region 44*a* and a low-resistance region 44*b*. The channel formation region 44*a* overlaps with the conductive layer 46 with the insulating layer 47 provided therebetween. The low-resistance region 44*b* has a portion connected to the conductive layer 43*a* and a portion connected to the conductive layer 43*b*.

[Step S5: Forming Light-Emitting Element 60]

Next, the components from the insulating layer 34 to the light-emitting element 60 are formed over the insulating layer 33 (FIG. 12(A)). For the steps, the manufacturing method example 1 can be referred to.

[Step S6: Sealing Light-Emitting Element 60]

Step S6 in the manufacturing method example 2 includes steps from Step S11 to Step S17 shown in FIG. 10. Detailed description thereof is given below.

[Step S11: Preparing Support Substrate 91]

First, a support substrate 91 is prepared (FIG. 12(B)). For the support substrate 91, a material that can be used for the support substrate 21 can be used.

[Step S12: Forming Separation Layer 92]

Next, a separation layer 92 is formed over the support substrate 91 (FIG. 12(B)). For the separation layer 92, a material that can be used for the separation layer 22 can be used.

[Step S13: Forming Inorganic Insulating Layer 93]

Next, an inorganic insulating layer 93 is formed over the separation layer 92 (FIG. 12(B)). For the inorganic insulating layer 93, a material that can be used for the inorganic insulating layer 23 can be used.

[Step S14: Forming Functional Layer]

Next, the coloring layer 97 and a light-blocking layer 98 are formed over the inorganic insulating layer 93 (FIG. 12(B)).

A color filter or the like can be used as the coloring layer 97. The coloring layer 97 is provided to overlap with a display region of the light-emitting element 60.

As the light-blocking layer 98, a black matrix or the like can be used. The light-blocking layer 98 is provided to overlap with the insulating layer 35.

[Step S15: Attaching Support Substrate 21 and Support Substrate 91]

Then, with the use of an adhesive layer 99, the surface of the support substrate 21 where the transistor 80 and the like are formed and the surface of the support substrate 91 where the separation layer 92 and the like are formed are attached to each other (FIG. 12(C)).

The light-emitting element 60 is positioned between the inorganic insulating layer 23 and the inorganic insulating layer 93. Atop surface and a bottom surface of the light-emitting element 60 are interposed between the inorganic insulating films, whereby entry of impurities into the light-emitting element 60 can be suppressed. Thus, a longer lifetime of the light-emitting element 60 becomes possible, and a display device in which deterioration of display using the light-emitting element 60 is less likely to be caused can be achieved. The transistor 80 is also positioned between the inorganic insulating layer 23 and the inorganic insulating layer 93. Therefore, entry of impurities into the transistor 80 can also be suppressed. Thus, variation in electrical characteristics of the transistor 80 can be suppressed.

Thus, a top surface and a bottom surface of the transistor 80 and the top surface and the bottom surface of the light-emitting element 60 are interposed between the inorganic insulating films, whereby entry of impurities into the transistor 80 and the light-emitting element 60 can be suppressed, leading to an increase in the reliability of the display device.

For the adhesive layer 99, a material that can be used for the adhesive layer 76 can be used As illustrated in FIG. 12(C), the support substrate 91 is preferably provided to overlap also with the connection electrode 45. Thus, the separability of an entire formation region of the layer to be separated can be made more uniform, so that the yield in a later separation step can be increased.

[Step S16: Separating Support Substrate 91]

Next, the support substrate 91 and the inorganic insulating layer 93 are separated from each other using the separation layer 92. A separation interface varies depending on the structure and the separation method of the support substrate 91, the separation layer 92, and the inorganic insulating layer 93. FIG. 13(A) illustrates an example where the separation occurs at the interface between the separation layer 92 and the inorganic insulating layer 93. For this step, the description of the separation step of the supporting substrate 21 in the manufacturing method example 1 can be referred to.

[Step S17: Attaching Flexible Substrate 75]

Next, with an adhesive layer 76, the flexible substrate 75 is attached to the inorganic insulating layer 93 exposed by the separation (FIG. 13(B)). A protective layer 79 is preferably stacked on an outer surface of the flexible substrate 75. This can prevent damage or contamination to the surface of the flexible substrate 75 in the subsequent step.

[Step S7: Separating Support Substrate 21]

Next, the support substrate 21 and the inorganic insulating layer 23 are separated from each other using the separation layer 22. A separation interface varies depending on the structure and the separation method of the support substrate 21, the separation layer 22, and the inorganic insulating layer 23. FIG. 14(A) illustrates an example where separation occurs at the interface between the separation layer 22 and the inorganic insulating layer 23.

[Step S8: Attaching Flexible Substrate 29]

Next, with the adhesive layer 28, the flexible substrate 29 is attached to the inorganic insulating layer 23 exposed by the separation (FIG. 14(B)). The protective layer 27 is preferably stacked on the outer surface of the flexible substrate 29.

The flexible substrate 29 (and the protective layer 27) also functions as a mask at the time of exposing the connection electrode 45. Thus, the flexible substrate 29 (and the protective layer 27) is provided so as not to overlap with at least part of the connection electrode 45.

[Step S9: Exposing Connection Electrode 45]

Figures 15A, 15B:
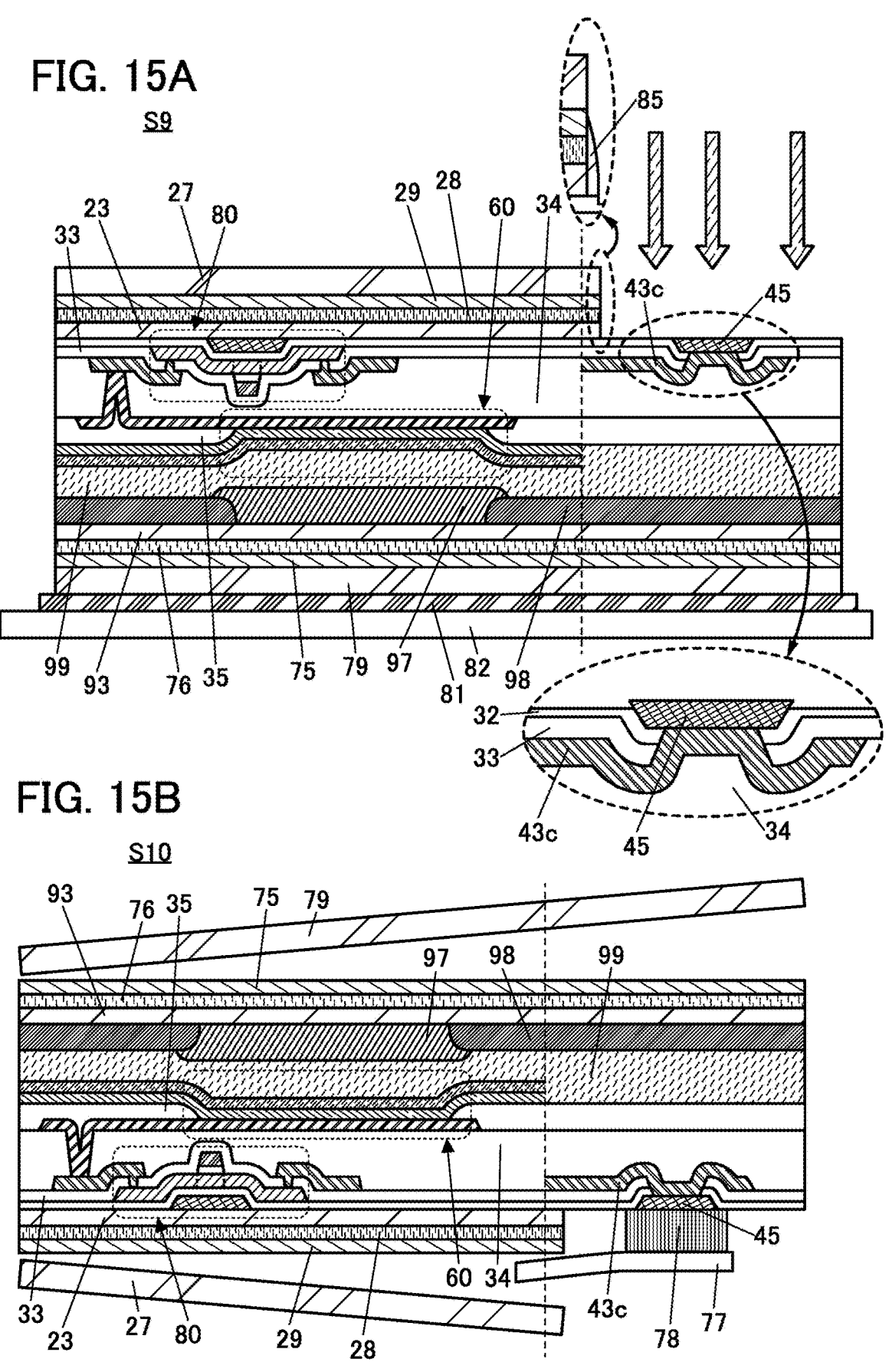
FIG. 15 Cross-sectional views illustrating an example of a method for manufacturing a display device.

Next, the inorganic insulating layer 23 is etched using the flexible substrate 29 (and the protective layer 27) as a mask to expose the connection electrode 45 (FIG. 15(A)). For the etching, either a dry etching method or a wet etching method can be used.

At this time, the thickness of the display device is extremely small, and it is preferable to fix the display device to the hard substrate 82 using the buffer layer 81 and proceed with the etching. For the hard substrate 82, a material that can be used for the support substrate 21 can be used. It is preferable that the protective layer 79 and the buffer layer 81 be easily separated from each other. For example, it is preferable that a silicone sheet be used as the buffer layer 81 and a glass substrate be used as the hard substrate 82.

Note that in the case where the separation layer 22 remains, both the separation layer 22 and the inorganic insulating layer 23 are removed to expose the connection electrode 45.

Note that not only the inorganic insulating layer 23 but also part of the insulating layer 32 may be etched. In an enlarged view of a portion including the connection electrode 45 illustrated in FIG. 15(A), an example in which the insulating layer 32 is partly removed, and the exposed surface of the connection electrode 45 is more projected than the exposed surface of the insulating layer 32 is shown.

In an enlarged view of a portion including the flexible substrate 29 in FIG. 15(A), an example in which the sidewall 85 is provided in contact with the side surface of the flexible substrate 29 and the side surface of the adhesive layer 28 is shown.

[Step S10: Mounting]

Then, the conductive electrode 45 and the FPC 77 are electrically connected to each other through the connector 78 (FIG. 15(B)).

It is preferable that the connection electrode 45 be more projected than the insulating layer 32 as illustrated in FIG. 15(A) because in that case an anchor effect is generated when the connector 78 is connected. Thus, adhesion between the connector 78 and the connection electrode 45 can be improved.

Through the above steps, the display device using an oxide semiconductor for the transistor and employing a color filter method for an EL element can be manufactured.

It is preferable that the protective layer 79 and the protective layer 27 be separated as illustrated in FIG. 15(B).

In the manufacturing method example 2, an example using a top-emission light-emitting element is shown. The flexible substrate 75 side is the display surface side, and thus if an external connection terminal is exposed from the flexible substrate 75 side and electrically connected to the FPC 77, the FPC 77 is not allowed to overlap with the display region and an area in which the FPC 77 overlaps with the display device is limited. In contrast, the connection electrode 45 can be easily exposed on a surface on the side opposite to the display surface by using one embodiment of the present invention. The FPC 77 can be placed on the side opposite to the display surface, and thus a space for bending the FPC 77 in incorporating the display device in an electronic device can be saved, which enables the electronic device to be smaller.

In the manufacturing method example 2, the display device is manufactured by performing the separation step twice. In one embodiment of the present invention, each of the functional elements and the like included in the display device is formed over the support substrate; thus, even in the case where a high-resolution display device is manufactured, high alignment accuracy of a flexible substrate is not required. It is thus easy to attach the flexible substrate.

As described above, by applying the manufacturing method example 2, the yield in the separation step in manufacturing the display device can be increased, and the connection electrode can be easily exposed.

[Structure Example 2 of Display Device]

Next, a display device 10E which can be manufactured by the manufacturing method example 2 will be described. Furthermore, a structure of a transistor that can be used in the display device of this embodiment will be described.

FIG. 16(A) is a top view of the display device 10E, and FIG. 16(B) is a cross-sectional view of the display device 10E.

The display device 10E includes the display portion 381 and the driver circuit portion 382. The display surface is a surface on the flexible substrate 75 side, and the FPC 77 is connected to a surface on a side opposite to the display surface. Thus, the FPC 77 can be provided to overlap with the display portion 381.

A cross-sectional structure of the display device 10E illustrated in FIG. 16(B) is similar to that of the structure manufactured by the manufacturing method example 2, and thus, detailed description thereof is omitted.

Each of FIGS. 16(C) and 16(D) illustrates a transistor having a structure different from that of the transistor described above.

A transistor 90 illustrated in FIG. 16(C) is a top-gate transistor including LTPS in its semiconductor layer.

The transistor 90 includes the conductive layer 41, the insulating layer 32, the conductive layer 43a, the conductive layer 43b, the semiconductor layer, and the insulating layer 33. The conductive layer 41 functions as a gate. The insulating layer 32 functions as a gate insulating layer. The semiconductor layer includes the channel formation region 44a and the pair of low-resistance regions 44b. The semiconductor layer may further include a LDD (Lightly Doped Drain) region. FIG. 16(C) illustrates an example in which an LDD region 44c is included between the channel formation region 44a and the low-resistance region 44b. The channel formation region 44a overlaps with the conductive layer 41 with the insulating layer 32 therebetween. The conductive layer 43a is electrically connected to one of the pair of low-resistance regions 44b through an opening provided in the insulating layer 32 and the insulating layer 33. In a similar manner, the conductive layer 43b is electrically connected to the other of the pair of low-resistance regions 44b. Any of a variety of inorganic insulating films can be used for the insulating layer 33. Specifically, a nitride insulating film is suitable for the insulating layer 33.

A transistor 95 illustrated in FIG. 16(D) is a bottom-gate transistor containing hydrogenated amorphous silicon in a semiconductor layer 42.

The transistor 95 includes the conductive layer 41, the insulating layer 32, the conductive layer 43a, the conductive layer 43b, an impurity semiconductor layer 49, and the semiconductor layer 42. The conductive layer 41 functions as a gate. The insulating layer 32 functions as a gate insulating layer. The semiconductor layer 42 overlaps with the conductive layer 41 with the insulating layer 32 therebetween. The conductive layer 43a and the conductive layer 43b are electrically connected to the semiconductor layer 42 through the impurity semiconductor layers 49. The transistor 95 is preferably covered with the insulating layer 33. Any of a variety of inorganic insulating films can be used for the insulating layer 33. Specifically, a nitride insulating film is suitable for the insulating layer 33.

As described above, in the method for manufacturing a display device of this embodiment, the yield in the separation step can be increased because both the display element and the connection electrode are sealed with the insulating layer or the sealing substrate in the step of sealing the display element. In addition, since the connection electrode is exposed using the flexible substrate (and the protective film) as a mask, a mask for exposing the connection electrode does not need to be prepared, leading to cost reduction. Thus, the display devices can be manufactured with high mass productivity.

This embodiment can be combined with the other embodiments as appropriate. In this specification, in the case where a plurality of structure examples are shown in one embodiment, the structure examples can be combined as appropriate.

Embodiment 2

In this embodiment, display devices of one embodiment of the present invention will be described with reference to FIG. 17.

FIG. 17(A1) is a schematic view of a display device of this embodiment. As a specific structure example of the display device, the display device 10A illustrated in FIG. 17(A2) can be given. Embodiment 1 can be referred to for the details of the display device 10A.

The display device in FIG. 17(A1) includes a flexible substrate 101, an adhesive layer 102, an inorganic insulating layer 103, a transistor 104, a light-emitting element 105, an insulating layer 108, an adhesive layer 109, and a flexible substrate 110. The flexible substrate 101 and the inorganic insulating layer 103 are attached to each other with the adhesive layer 102. The transistor 104 and the light-emitting element 105 are provided over the inorganic insulating layer 103. The light-emitting element 105 is covered with the insulating layer 108, and the light-emitting element 105 is sealed with a film. The insulating layer 108 and the flexible substrate 110 are attached to each other with the adhesive layer 109.

FIG. 17(B1) is a schematic view of a display device of this embodiment. As a specific structure example of the display device, the display device 10E illustrated in FIG. 17(B2) can be given. Embodiment 1 can be referred to for the details of the display device 10E.

The display device in FIG. 17(B1) includes the flexible substrate 101, the adhesive layer 102, the inorganic insulating layer 103, the transistor 104, the light-emitting element 105, an adhesive layer 106, a coloring layer 107, the insulating layer 108, the adhesive layer 109, and the flexible substrate 110. The flexible substrate 101 and the inorganic insulating layer 103 are attached to each other with the adhesive layer 102. The flexible substrate 110 and the insulating layer 108 are attached to each other with the adhesive layer 109. The transistor 104 and the light-emitting element 105 are provided over the inorganic insulating layer 103. The inorganic insulating layer 103 and the insulating layer 108 are attached to each other with the adhesive layer 106, and the light-emitting element 105 is solid-sealed. The insulating layer 108 and the flexible substrate 110 are attached to each other with the adhesive layer 109.

The display device of this embodiment is formed to be repeatedly bendable. Specifically, the rate of the strain applied to the flexible substrate 101 when the display device is bent is lower than or equal to the rate of the strain at the yield point of the flexible substrate 101. Similarly, the rate of the strain applied to the flexible substrate 110 when the display device is bent is lower than or equal to the rate of the strain at the yield point of the flexible substrate 110.

The display device of this embodiment has a structure in which a fold (also referred to as warpage) is not generated even when the display device is repeatedly bent more than 50,000 times, preferably more than 100,000 times under conditions where the rate of the strain applied to the flexible substrate 101 is lower than or equal to the rate of the strain at the yield point of the flexible substrate 101, and the rate of the strain applied to the flexible substrate 110 is lower than or equal to the rate of the strain at the yield point of the flexible substrate 110.

Here, the yield point of a resin film favorable for the flexible substrate is described with reference to FIG. 18.

Figure 18:
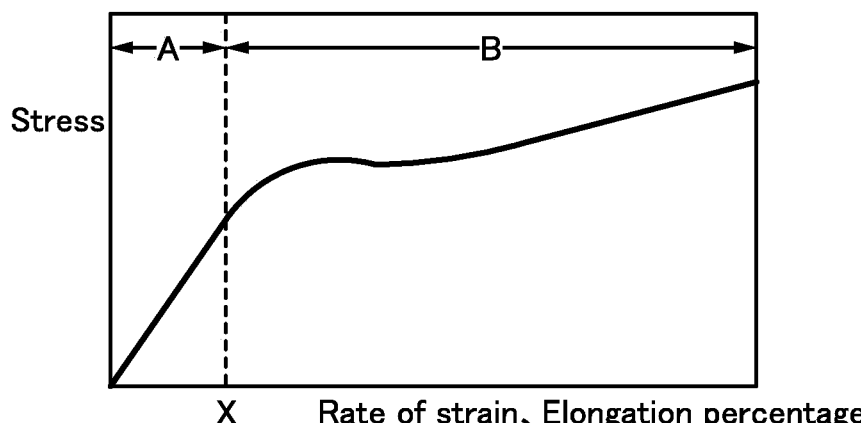
FIG. 18 A graph showing a stress-strain curve of a resin film.

FIG. 18 is a schematic view of a stress-strain curve of a resin film. The vertical axis indicates a stress, and the horizontal axis indicates a rate of strain (also referred to as elongation percentage, and the unit is %). Region A is a portion whose stress is increased in proportion to the strain (also referred to as an elastically deformed region). A portion from which the strain is not proportional to the stress is a boundary between Region A and Region B (also referred to as a plastically deformed region). In this specification, the boundary is referred to as the yield point of the resin film. The rate of the strain at the yield point corresponds to X in the graph.

The curvature radius in bending the display device, the thickness of the display device, the material and the thickness of each layer constituting the display device, and the like are preferably determined so that the rate of the strain applied to each of the flexible substrate 101 and the flexible substrate 110 is lower than or equal to the rate of the strain at the corresponding yield point.

This embodiment can be combined with the other embodiments as appropriate.

Embodiment 3

In this embodiment, electronic devices of one embodiment of the present invention will be described with reference to drawings.

Examples of electronic devices include a television set, a monitor of a computer or the like, a digital camera, a digital video camera, a digital photo frame, a mobile phone (also referred to as a cellular phone or a mobile phone device), a portable game machine, a portable information terminal, an audio reproducing device, and a large game machine such as a pinball machine.

The electronic devices of one embodiment of the present invention include the display device of one embodiment of the present invention in its display portion and thus has high resistance to repeated bending and high reliability.

By using the display device of one embodiment of the present invention, a highly reliable electronic device can be achieved with high mass productivity at low cost.

The display portion of the electronic device in this embodiment can display a video with a resolution of, for example, full high definition, 4K2K, 8K4K, 16K8K, or higher. In addition, as a screen size of the display portion, the diagonal size can be greater than or equal to 20 inches, greater than or equal to 30 inches, greater than or equal to 50 inches, greater than or equal to 60 inches, or greater than or equal to 70 inches.

The electronic device of one embodiment of the present invention has flexibility and therefore can be incorporated along a curved surface of an inside or outside wall of a house or a building or a curved surface of an interior or an exterior of an automobile.

Furthermore, the electronic device of one embodiment of the present invention may include a secondary battery. It is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figures 19A, 19B, 19C, 19D:
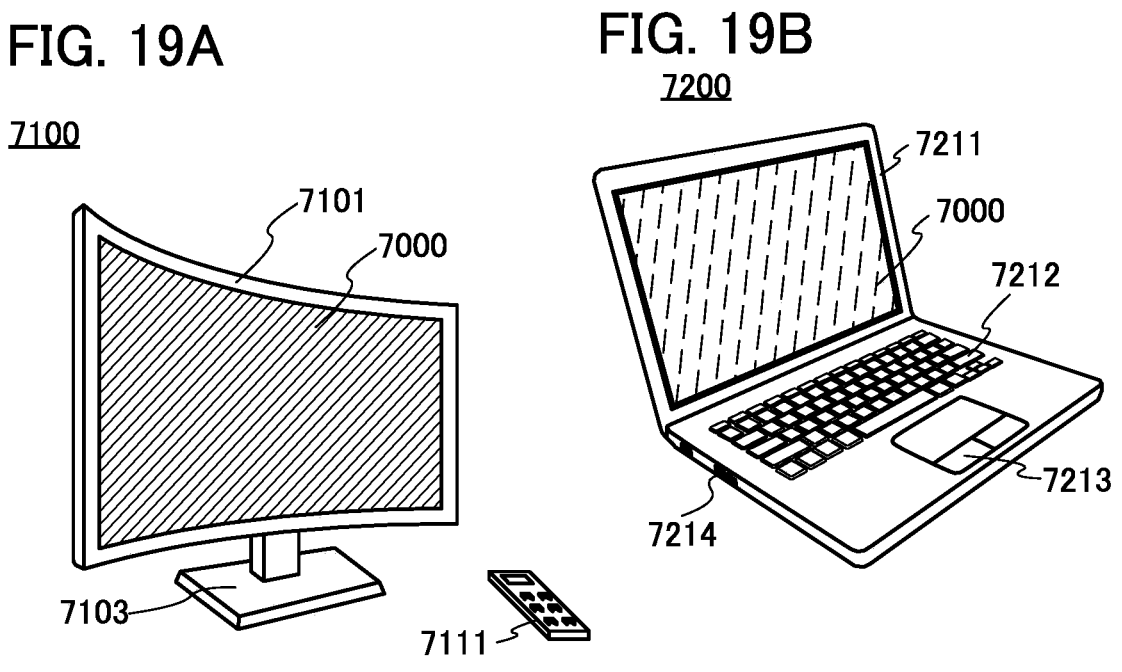
FIG. 19 Diagrams illustrating examples of an electronic device.

FIG. 19(A) illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 19(A) can be performed with an operation switch provided in the housing 7101 or a separate remote controller 7111. Alternatively, the display portion 7000 may include a touch sensor, and the television device 7100 can be operated by touching the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 19(B) illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIGS. 19(C) and 19(D) illustrate examples of digital signage,

Digital signage 7300 illustrated in FIG. 19(C) includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 19(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIGS. 19(C) and (D).

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

Furthermore, as illustrated in FIGS. 19(C) and (D), it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIGS. 20(A) to 20(F) illustrate examples of a portable information terminal including a flexible display portion 7001.

The display portion 7001 is manufactured using the display device of one embodiment of the present invention. For example, a display device including a display panel that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

FIGS. 20(A) to 20(C) illustrate an example of a foldable portable information terminal. FIG. 20(A) illustrates an opened state, FIG. 20(B) illustrates a state in the middle of change from one of an opened state and a folded state to the other, and FIG. 20(C) illustrates a folded state of the portable information terminal 7600. The portable information terminal 7600 is highly portable when folded, and is highly browsable when opened because of a seamless large display area.

The display portion 7001 is supported by three housings 7601 joined together by hinges 7602. By folding a space between two housings 7601 with the hinges 7602, the portable information terminal 7600 can be reversibly changed in shape from an opened state to a folded state.

FIGS. 20(D) and 20(E) illustrate an example of a foldable portable information terminal. FIG. 20(D) illustrates a portable information terminal 7650 that is folded so that the display portion 7001 is on the inside; FIG. 20(E) illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby contamination of or damage to the display portion 7001 can be suppressed.

FIG. 20(F) illustrates an example of a wrist-watch-type portable information terminal. A portable information terminal 7800 includes a band 7801, the display portion 7001, an input-output terminal 7802, operation buttons 7803, and the like. The band 7801 has a function of a housing. A flexible battery 7805 can be mounted on the portable information terminal 7800. The battery 7805 may overlap with the display portion 7001 or the band 7801, for example.

The band 7801, the display portion 7001, and the battery 7805 have flexibility. Thus, the portable information terminal 7800 can be easily curved to have a desired shape.

The operation button 7803 can give a variety of functions such as time setting, on/off of the power, on/off of wireless communication, setting and cancellation of silent mode, and setting and cancellation of power saving mode. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can execute near field communication conformable to a communication standard. For example, mutual communication with a headset capable of wireless communication enables hands-free calling.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figures 21A, 21B, 21C:
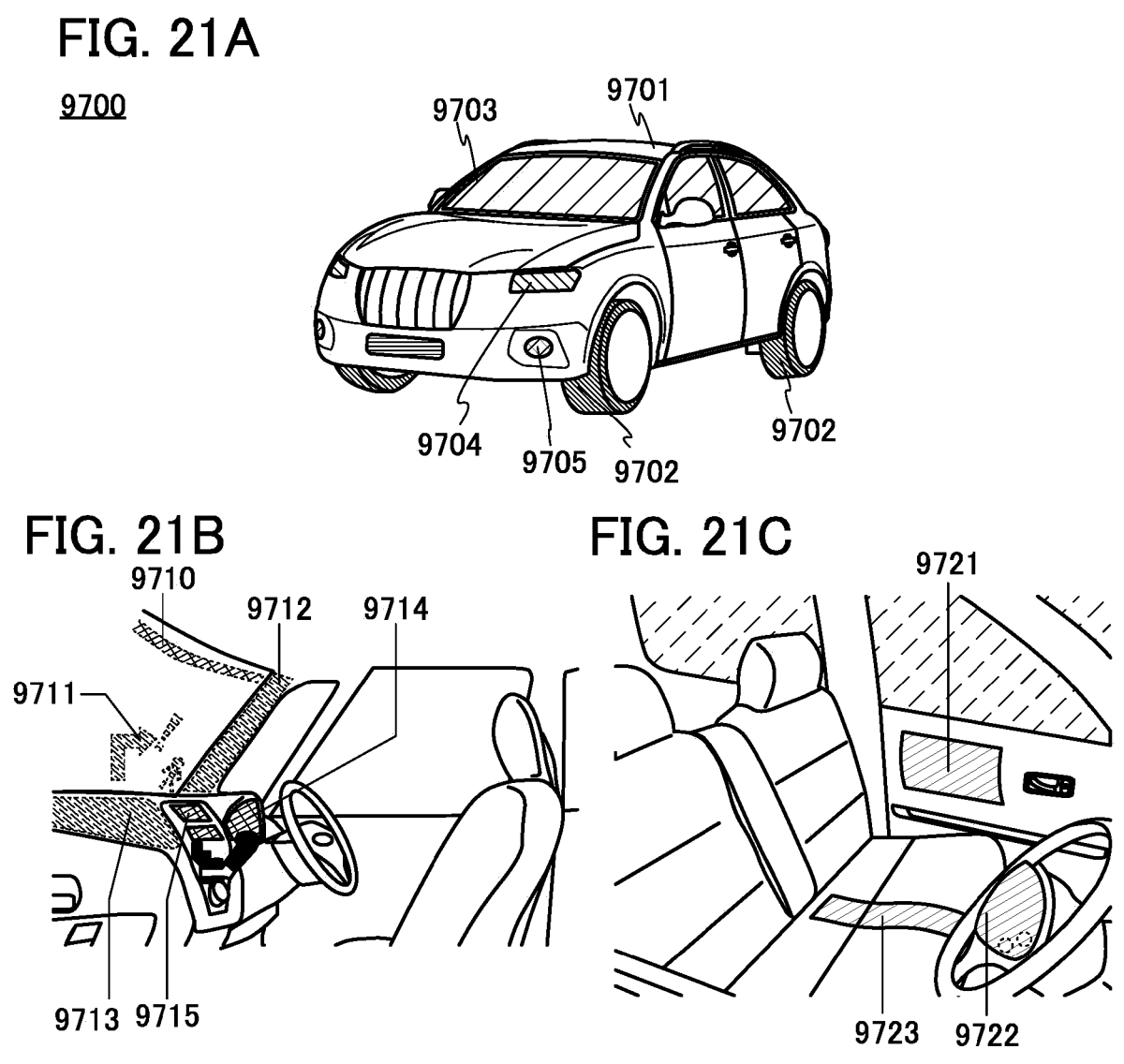

FIG. 21(A) is an external view of an automobile 9700. FIG. 21(B) illustrates a driver's seat of the automobile 9700. The automobile 9700 includes a car body 9701, wheels 9702, a windshield 9703, lights 9704, fog lamps 9705, and the like. The light-emitting device, display device, input/output device, or the like of one embodiment of the present invention can be used in a display portion of the automobile

9700, for example. For example, the light-emitting device or the like of one embodiment of the present invention can be provided for a display portion 9710 to a display portion 9715 illustrated in FIG. 21(B). Alternatively, the light-emitting device or the like of one embodiment of the present invention may be used in the lights 9704 or the fog lamps 9705.

The display portion 9710 and the display portion 9711 are display devices provided in an automobile windshield. The light-emitting device or the like of one embodiment of the present invention can be a see-through device, through which the opposite side can be seen, by using a light-transmitting conductive material for forming its electrodes and wirings. Such a display portion 9710 or 9711 in a see-through state does not hinder driver's vision during driving of the automobile 9700. Therefore, the light-emitting device or the like of one embodiment of the present invention can be provided in the windshield of the automobile 9700. In the case where a transistor for driving the light-emitting device or the like is provided, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

FIG. 21(C) illustrates the inside of a car in which a bench seat is used as a driver seat and a front passenger seat A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Provided on the seating surface, backrest, or the like, the display device can be used as a seat heater with heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The above information can also be displayed on the display portion 9710 to the display portion 9713, the display portion 9721, and the display portion 9723. The display portion 9710 to the display portion 9715 and the display portion 9721 to the display portion 9723 can also be used as lighting devices. The display portion 9710 to the display portion 9715 and the display portion 9721 to the display portion 9723 can also be used as heating devices.

This embodiment can be combined with the other embodiments as appropriate.

Example 1

In this example, the bending characteristics of a display panel of one embodiment of the present invention were evaluated.

[Repeated Bending Test of Display Panel]

In this example, three kinds of display panels were fabricated and subjected to a repeated bending test.

Sample A is a display panel that has the structure illustrated in FIG. 17(B1) and has a thickness of approximately 55 μm. For each of the flexible substrate 101 and the flexible substrate 110 of Sample A, a film having a thickness of approximately 20 μm was used.

Sample B is a display panel that has the structure illustrated in FIG. 17(B1) and has a thickness of approximately 27 μm. For each of the flexible substrates 101 and the flexible substrate 110 of the sample B, a film having a thickness of approximately 6.5 μm was used.

Sample C is a display panel that has the structure illustrated in FIG. 17(A1) and has a thickness of approximately 21 μm. For each of the flexible substrate 101 and the flexible substrate 110 of the sample C, a film having a thickness of approximately 6.5 μm was used.

Figure 22A:
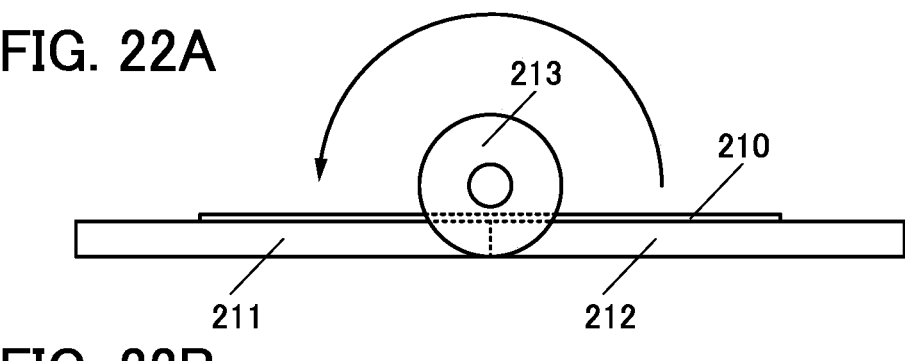
FIG. 22(A) (B) Diagrams illustrating a bend tester in Example 1. (C) A diagram showing a force applied to a display panel.
Figure 22B:
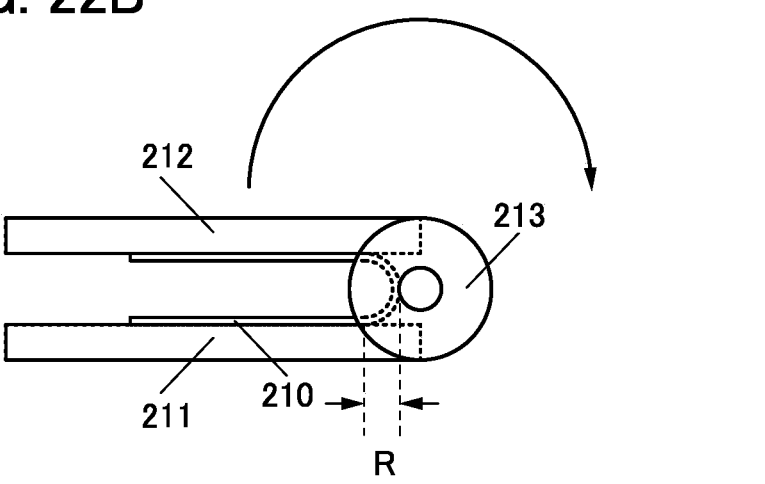

The repeated bending test was performed with the use of a book-type repeated bend tester illustrated in FIGS. 22(A) and 22(B).

The tester illustrated in FIGS. 22(A) and 22(B) includes a stage 211, a stage 212, and a rotation axis 213. The stage 211 and the stage 212 are connected by the rotation axis 213. A display panel 210 is positioned over the stage 211 and the stage 212. With a rotating mechanism of the rotation axis 213, the stage 212 turns 180° from the state of FIG. 22(A) to the state of FIG. 22(B). Thus, the display panel 210 is bent with a radius of curvature R. Furthermore, the stage 212 turns 1800 from the state of FIG. 22(B) to the state of FIG. 22(A) with the rotating mechanism. Thus, the display panel 210 is returned from the bent state to a flat shape. The repeated bending test is performed by repeating the state of FIG. 22(A) and the state of FIG. 22(B). The rate of the repeated bending test is 2 seconds/time.

In this example, an outward bending test in which the display panel was bent such that the display surface of the display panel faced outward was performed. Three radii of curvature R were used: 0.5 mm, 1.0 mm, and 2.0 mm. The number of times of repeating bending in one test was 100,000 times, and whether warpage was caused after the test was visually confirmed.

Table 1 shows the test results. In Table 1, a circle represents conditions where warpage was not observed, and a cross represents conditions where warpage was observed.

TABLE 1

| | Radius of curvature | | |
| --- | --- | --- | --- |
| | 0.5 mm | 1.0 mm | 2.0 mm |
| Sample A | X | X | X |
| Sample B | X | X | O |
| Sample C | X | O | O |

In Sample A having the largest thickness, warpage was observed in each case of the three radii of curvature R. In Sample B having the second largest thickness, warpage was not observed in the case where the radius of curvature R was 2.0 mm, but warpage was observed in the case where the radius of curvature R was 1.0 mm and 0.5 mm. In Sample C having the smallest thickness, warpage was not observed in the case where the radius of curvature R was 2.0 mm and 1.0 mm, and warpage was observed in the case where the radius of curvature R was 0.5 mm.

[Estimation of Strain Applied to Display Panel Due to Bending]

Figure 22C:
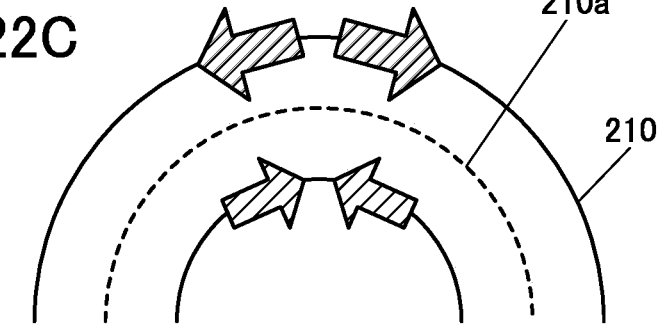

When the display panel 210 is bent as illustrated in FIG. 22(C), the outer side of the display panel 210 is stretched to generate tensile stress. On the other hand, the inner side of the display panel 210 is pressed to generate compressive stress. Furthermore, a neutral plane 210a (a plane that is not stretched or compressed) exists near the center of the display panel 210 in a thickness direction. The tensile stress or the compressive stress is increased in proportion to the distance from the neutral plane 210a.

Next, strain applied to the display panels due to bending was estimated using ANSYS Mechanical APDL that is software for heat transfer-structure coupled analysis. Note that for simplification of the calculation, simulation was performed using two-dimensional models obtained by cutting out only bent portions in the range of 0.5 mm. As display panel models, simple stacked-layer structures corresponding to the three kinds of Sample A to Sample C described above were created. In a manner similar to that of the bending test, estimation in the case where the three kinds of samples were bent with the three radii of curvature (R=0.5 mm, 1.0 mm, and 2.0 mm) was performed.

In order to reproduce a state where each of the display panels was bent, the center of the model was restrained, a downward force was applied to edge portions of the model on the right and left; outward bending was expressed in such a way. Specific calculation conditions were as follows: the mesh condition: a 1-μm² square, mapped mesh; the restrain condition: omnidirectional displacement; Element Type: PLANE183 (Solid 8 node quad); and Material Model: Structural-Linear-Elastic-Isotropic.

Figure 23A:
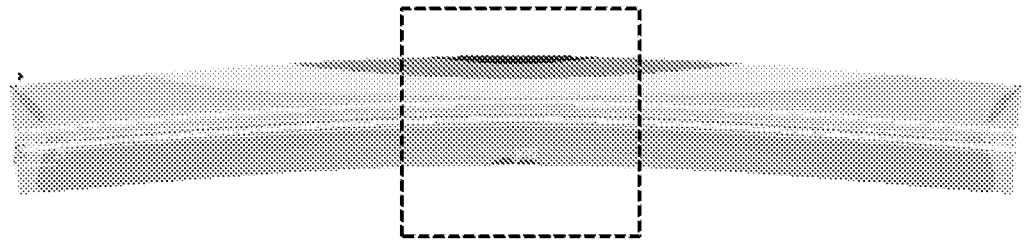
FIG. 23 Diagrams showing simulation results in Example 1.
Figure 23B:
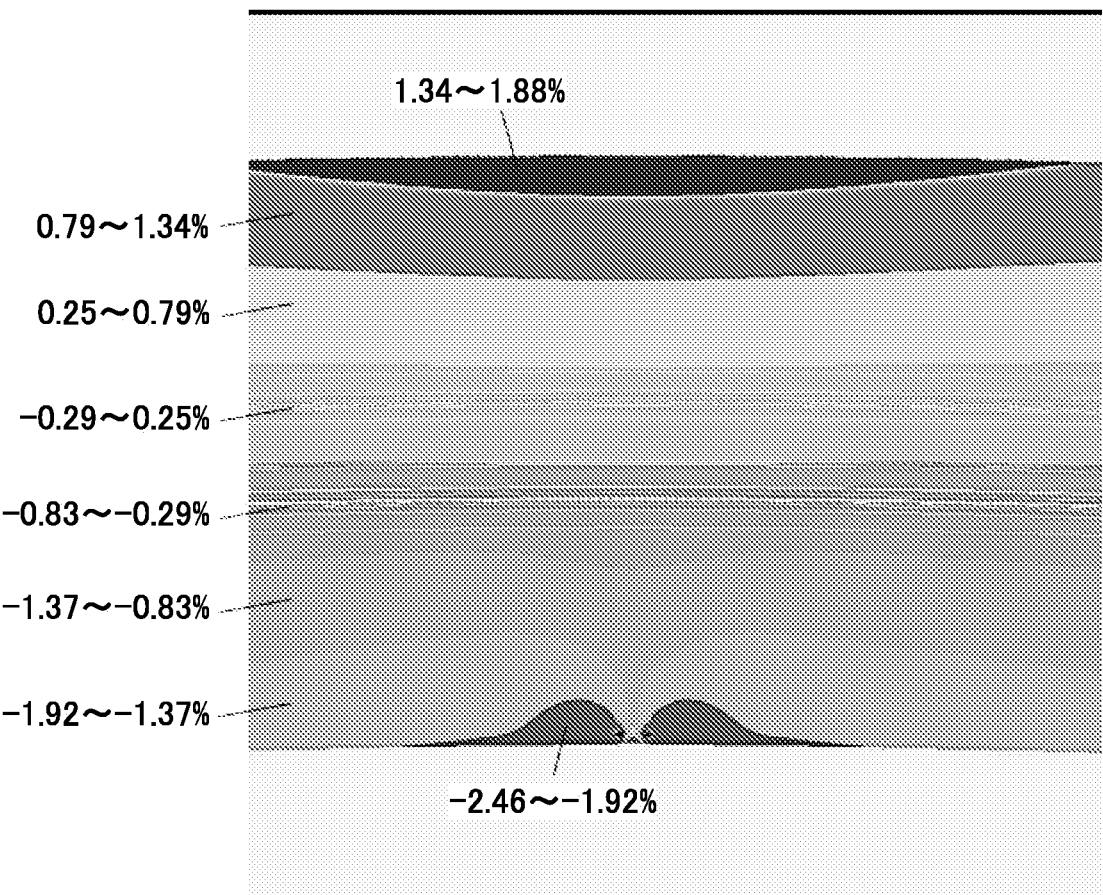
Figure 23C:
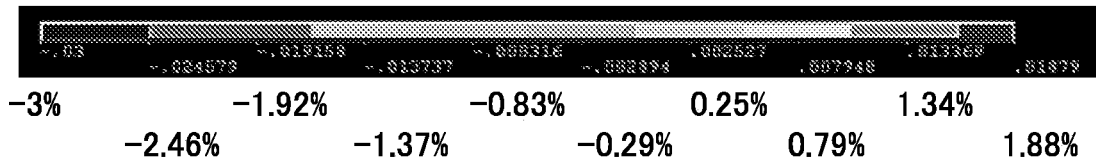

FIG. 23 shows a calculation result of stress distribution in the case where the display panel of Sample A was bent with a radius of curvature R=2.0 mm. FIG. 23(A) illustrates a state where the display panel was bent by restraining a top and a bottom in the center of the display panel and applying a force to both edges of a surface of the film. FIG. 23(B) is an enlarged view of the inside of the frame of the dashed line in FIG. 23(A). FIG. 23(C) shows a scale, and a positive value represents tensile stress and a negative value represents compressive stress.

As shown in FIG. 23(B), it was found that tensile stress was generated on the outer side of the display panel, and compressive stress was generated on the inner side. It was found from FIG. 23(B) that, when the display panel was bent outward, the largest strain was generated on an outermost surface of an outer film.

Figure 24:
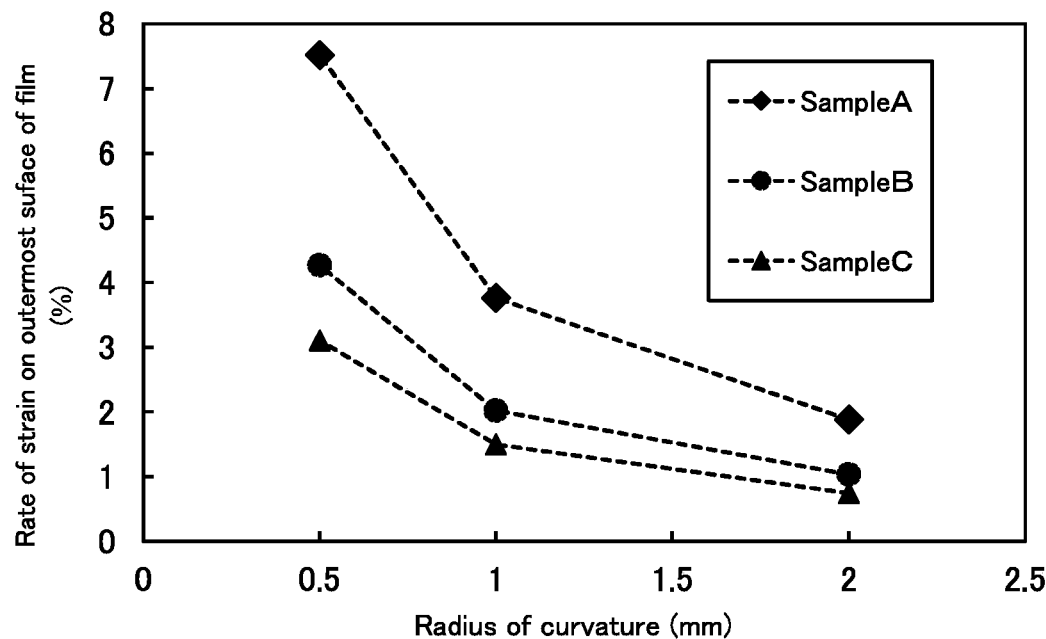
FIG. 24 A graph showing simulation results in Example 1.

FIG. 24 shows rates of strain generated on the outermost surfaces of outer films in the corresponding conditions. The conditions represented by circles in Table 1 were conditions under which the rate of the strain shown in FIG. 24 was as small as approximately 2% or lower.

Moreover, the rates of the strain at the yield points of the films used in this example were approximately 2%.

From the above, it was suggested that when, in bending the display device, the rate of the strain applied to an outer film was lower than or equal to the rate of the strain at the yield point of the film, warpage was not generated in the display panel even after bending was repeated 100,000 times.

Example 2

In this example, viewing angle characteristics of a display panel of one embodiment of the present invention were evaluated.

In this example, a flexible organic EL panel (hereinafter also referred to as FOLED) that includes subpixels of three colors of red (R), green (G), and blue (B) and can perform full-color display was examined.

A display panel has viewing angle dependence; therefore, when the FOLED is curved, one who stands right in front of the center of the FOLED and sees the curved edge portions of the FOLED may observe color shift or the like, for example, When a method for separately forming light-emitting layers for different colors of subpixels (syde-by-side, here-inafter also referred to as SBS) and a method for using a white light-emitting element and a color filter are compared, it is considered that color shift due to the viewing angle is smaller in the method using a color filter. This is because light that is color shifted can be absorbed with a color filter.

In this example, the viewing angle characteristics of the FOLED employing a color filter method were measured.

FIG. 25(A) and Table 2 show a display panel used in this example. As illustrated in FIG. 25(A), the display panel includes a light-emitting element between a pair of sub-strates (FET substrate and Color filter substrate). The light-emitting element is a white light-emitting element having a tandem structure in which a blue fluorescent unit and a green and red phosphorescent unit are stacked (Type: White tandem top-emitting OLED with color filters (WTC)). Specifi-cally, the light-emitting element includes a reflective anode (Reflective Anode with resonant cavity), a hole-injection/transport layer (Hole Injection/Transport Layer), a blue light-emitting layer (Blue Emission Layer), an intermediate layer (Intermediate Layer), a green light-emitting layer (Green Emission Layer), a red light-emitting layer (Red Emission Layer), an electron-transport/injection layer (Elec-tron Transport/Injection Layer), and a semi-reflective cath-ode (Semi-reflective Cathode). The anode includes an opti-cal adjustment layer for achieving a micro optical resonator (also referred to as microcavity) structure. The pair of substrates are attached to each other with a resin (Resin). Colors of the color filters are three colors, red (R), green (G), and blue (B). The diagonal size of a display region of the display panel is 3.4 inches (Screen diagonal: 3.4 inch). The light-emitting element is driven by a transistor using a CAAC-OS (c-axis aligned crystalline oxide semiconductor) (Driving method: CAAC-OS FET). The number of pixels (Pixel count) is 540×RGB×60. The resolution is 326 ppi. The aperture ratio is 44.4% (OLED fill factor: 44.4%). A scan driver is incorporated in the display panel (Scan driber: Integrated), a video signal is an analog signal, and line sequential driving is employed (Source driver: Analog, switch integrated). The display panel can be bent more than 100,000 times with a radius of curvature of 5 mm (Bend-ability: >100 k times @ r=5 mm). The display panel has a thickness of approximately 70 μm and a weight of approxi-mately 2 g (Thickness/weight: 70 μm/2 g). The maximum power consumption of the display panel is approximately 570 mW (Power consumption: 570 mW (max)). The area ratio of the color gamut of the display panel in the CIE 1976 chromaticity coordinates (u',v' chromaticity coordinates) with respect to the color gamut in the NTSC standards is 93% (Color gamut: 93% NTSC CIE 1976 u',v'). A connector of an FPC is provided for a short side of the display panel.

In this example, the axis along which the display panel is bent is parallel to the short side of the display panel.

TABLE 2

| Screen diagonal | 3.4 inch |
| --- | --- |
| Driving method | CAAC-OS FFT |
| Pixel count | 540 × RGB × 960 |
| Resolution | 326 PPI |
| OLED fill factor | 44.40% |
| Scan driver | Integrated |
| Source driver | Analog, switch integrated |
| Type | White tandem top-emitting OLED with color fiters(WTC) |
| Bendability | >100k times @ r = 5 mm |
| Thickness/weight | 70 μm/2 g |
| Power consumption | 570 mW (max) |
| Color gamut | 93% NTSC (CIE 1976 u'v') |

In this example, measurement was performed using an LCD evaluation system (LCD-7200, produced by Otsuka Electronics Co., Ltd.) including a multi-channel spectropho-tometer (MCPD-7000, produced by Otsuka Electronics Co., Ltd.).

FIG. 25(B) is a schematic view of a measurement method. A measurement spot having a diameter of 3 mm was placed on the center of the display panel (Sample) and measured every 0.5° of the polar angle θ of a detector (Light measur-ing device: LMD). In order to suppress stray light from a fixed portion or the like of the display panel, a region where an image is displayed at the measurement was not an entire surface of the display panel but 4%.

The display panel was attached to the inside or the outside of an acrylic half cylinder. There are two kinds of acrylic cylinders having external diameters of 50 mm and 100 mm, each of which had a thickness of 5 mm. Thus, the display panel can be kept in a state of being bent with a uniform radius of curvature (r) of approximately −45 mm, approxi-mately −20 mm, approximately 25 mm, or approximately 50 mm. Note that a negative value represents a state where a display surface is bent inward (also referred to as inward bending or having a concave display surface), and a positive value represents a state where a display surface is bent outward (also referred to as outward bending or having a convex display surface). That is, the radius of curvature in inward bending is 20 mm and 45 mm and the radius of curvature in outward bending is 25 mm and 50 mm. Fur-thermore, for comparison, the display panel in a flat state without using a cylinder was also measured. The measure-ment was performed in steps of 0.5°.

Figure 26:
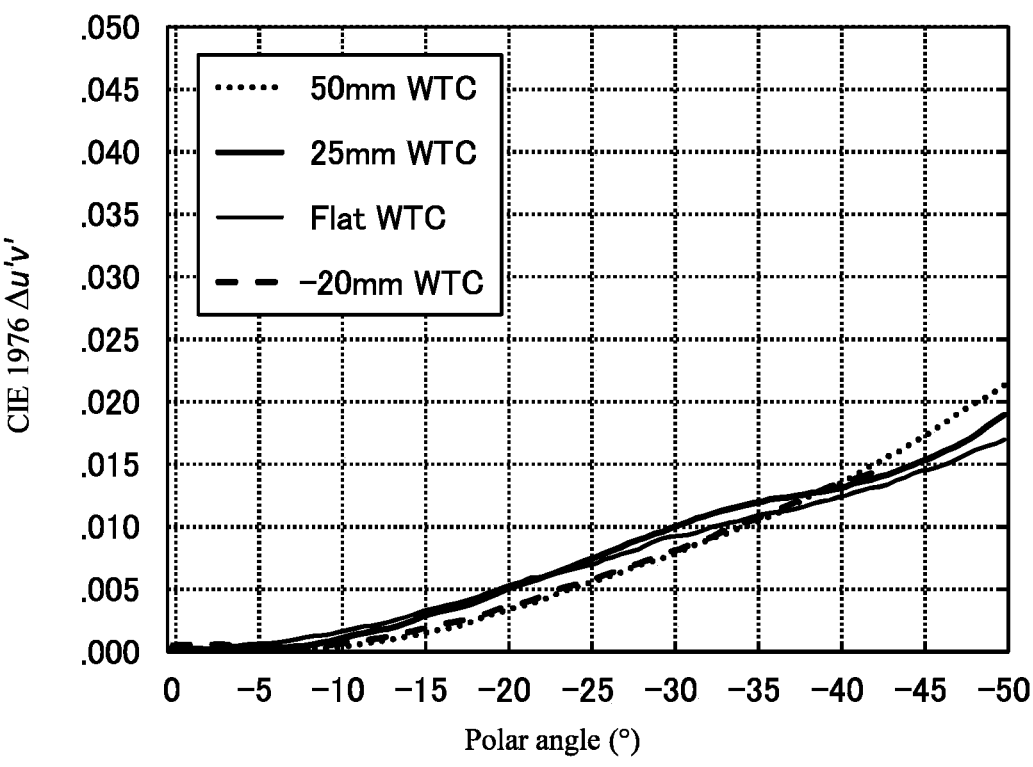
FIG. 26 A graph showing measurement results in Example 2.

FIG. 26 shows measurement results of color shift when the display panel displayed a white image. As shown in FIG. 26, in the display panel of this example that employs a method using a white light-emitting element and a color filter, the color shift was within 0.025 even when the viewing angle was 500. On the other hand, in a comparative display panel using a SBS method, the color shift exceeded 0.035 at the viewing angle of 50°. From these results, it was found that by employing the method using a white light-emitting element and a color filter, the viewing angle depen-dence was able to be made small.

Figure 27:
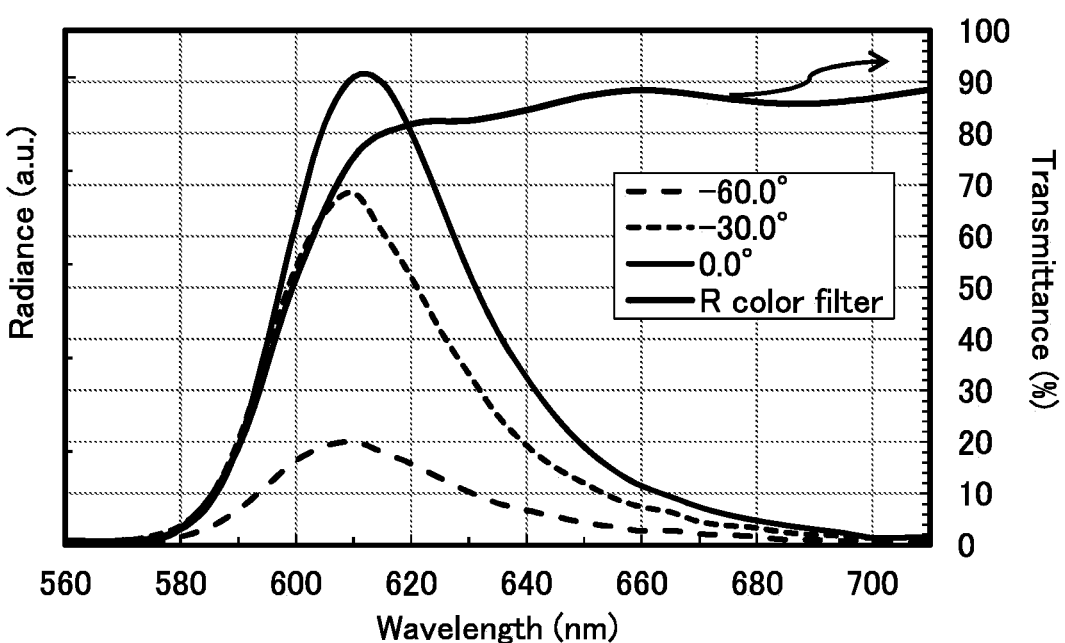
FIG. 27 A graph showing measurement results in Example 2.

FIG. 27 shows measurement results of spectra when only a red pixel emitted light in a state where the display panel was flat. In FIG. 27, the vertical axis represents radiance (arbitrary unit) and transmittance (%), and the horizontal axis represents a wavelength (unit: nm). As shown in FIG. 27, peak wavelengths of red when the viewing angles were 30° and 60° are shifted to a shorter wavelength side than when the viewing angle was 0°. However, it is found that light on the shorter wavelength side is cut by the red color filter. This shows that by using a color filter, color shift due to an viewing angle can be suppressed, so that the viewing angle dependence can be made small.

REFERENCE NUMERALS

10A: display device, 10B: display device, 10C: display device, 10D: display device, 10E: display device, 21: support substrate, 22: separation layer, 22a: separation layer, 22b: separation layer, 23: inorganic insulating layer, 27: protective layer, 28: adhesive layer, 29: flexible substrate, 32: insulating layer, 33: insulating layer, 34: insulating layer, 35: insulating layer, 40: transistor, 41: conductive layer, 42: semiconductor layer, 43a: conductive layer, 43b: conductive layer, 43c: conductive layer, 44: oxide semiconductor layer, 44a: channel formation region, 44b: low-resistance region, 44c: LDD region. 45: connection electrode, 46: conductive layer, 47: insulating layer, 49: impurity semiconductor layer, 50: transistor, 60: light-emitting element, 61: conductive layer, 62: EL layer, 63: conductive layer, 71: protective layer, 74: insulating layer, 75: flexible substrate, 76: adhesive layer, 77: FPC, 78: connector, 79: protective layer, 80: transistor, 81: buffer layer, 82: hard substrate, 85: sidewall, 90: transistor, 91: support substrate, 92: separation layer, 93: inorganic insulating layer, 95: transistor. 97: coloring layer, 98: light-blocking layer, 99: adhesive layer, 101: flexible substrate. 102: adhesive layer, 103: inorganic insulating layer, 104: transistor, 105: light-emitting element. 106: adhesive layer, 107: coloring layer, 108: insulating layer, 109: adhesive layer, 110: flexible substrate, 210: display panel, 210a: neutral plane, 211: stage, 212: stage, 213: rotation axis, 381: display portion, 382: driver circuit portion, 7000: display portion, 7001: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 7600: portable information terminal, 7601: housing, 7602: hinge, 7650: portable information terminal, 7651: non-display portion, 7800: portable information terminal 7801: band, 7802: input-output terminal, 7803: operation button, 7804: icon, 7805: battery, 9700: automobile, 9701: car body, 9702: wheel, 9703: windshield, 9704: light, 9705: fog lamp, 9710: display portion, 9711: display portion, 9712: display portion, 9713: display portion, 9714: display portion, 9715: display portion, 9721: display portion, 9722: display portion, 9723: display portion

What is claimed is:

1. A display device comprising:
a first substrate;
a first inorganic insulating layer;
a display element;
a connection electrode;
a second inorganic insulating layer; and
a sidewall,
wherein the first substrate overlaps with the display element with the first inorganic insulating layer interposed therebetween,
wherein the display element is positioned between the first inorganic insulating layer and the second inorganic insulating layer,
wherein the connection electrode does not overlap with the first substrate and the first inorganic insulating layer, wherein the sidewall is in contact with at least part of a side surface of the first substrate, and
wherein the sidewall comprises one or both of an element contained in the first inorganic insulating layer and halogen.

2. The display device according to claim 1, further comprising:
a transistor,
wherein the transistor comprises an electrode and an insulating layer,
wherein the electrode comprises the same material as a material of the connection electrode,
wherein the insulating layer covers at least part of the connection electrode and at least part of the electrode, and
wherein the insulating layer comprises a region where the insulating layer does not overlap with the first substrate and the first inorganic insulating layer.

3. The display device according to claim 2,
wherein the connection electrode is more projected than the insulating layer in the region where the insulating layer does not overlap with the first substrate and the first inorganic insulating layer.

4. A display module comprising:
the display device according to claim 1; and
a circuit board,
wherein the connection electrode is electrically connected to the circuit board.

5. The display device according to claim 2,
wherein the transistor comprises a metal oxide in a semiconductor layer.

6. The display device according to claim 2,
wherein the transistor comprises silicon in a semiconductor layer.

7. The display device according to claim 2,
wherein the display element is a light-emitting element including a light-emitting organic compound.

8. The display device according to claim 1, wherein the sidewall is in contact with a side surface of the first inorganic insulating layer.

9. An electronic device comprising:
a display device;
a circuit board; and
at least any one of an antenna, a battery, a housing, a camera, a speaker, a microphone, and an operation button,
wherein the display device comprises a first substrate, a first inorganic insulating layer over the first substrate, a display element over the first inorganic insulating layer, a second inorganic insulating layer over the display element, a sidewall in contact with a side surface of the second inorganic insulating layer, and a second substrate over the second inorganic insulating layer,
wherein the display device is repeatedly bendable,
wherein the sidewall comprises one or both of an element contained in the first inorganic insulating layer and halogen,
wherein when the display device is bent, the rate of the strain applied to the first substrate is lower than or equal to the rate of the strain at the yield point of the first substrate, and
wherein when the display device is bent, the rate of the strain applied to the second substrate is lower than or equal to the rate of the strain at the yield point of the second substrate.

10. The electronic device according to claim 9, wherein the display device further comprises a connection electrode, wherein the connection electrode does not overlap with the first substrate and the first inorganic insulating layer, and wherein the connection electrode is electrically connected to the circuit board.

11. The display device according to claim 9, further comprising:

a transistor, wherein the transistor comprises a metal oxide in a semiconductor layer.

12. The display device according to claim 9, further comprising:

a transistor, wherein the transistor comprises silicon in a semiconductor layer.

13. The display device according to claim 9, wherein the display element is a light-emitting element including a light-emitting organic compound.

14. The display device according to claim 9, wherein the sidewall is in contact with a side surface of the first inorganic insulating layer.

\* \* \* \* \*